United States Patent
Ema et al.

(10) Patent No.: US 7,605,041 B2
(45) Date of Patent: Oct. 20, 2009

(54) SEMICONDUCTOR DEVICE AND ITS MANUFACTURE METHOD

(75) Inventors: Taiji Ema, Kawasaki (JP); Hideyuki Kojima, Kawasaki (JP); Toru Anezaki, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 12/000,047

(22) Filed: Dec. 7, 2007

(65) Prior Publication Data

US 2008/0090364 A1    Apr. 17, 2008

Related U.S. Application Data

(60) Division of application No. 11/168,553, filed on Jun. 29, 2005, now Pat. No. 7,323,754, which is a continuation of application No. PCT/JP03/04589, filed on Apr. 10, 2003.

(51) Int. Cl.
    *H01L 21/336* (2006.01)
(52) U.S. Cl. .................. 438/289; 257/391
(58) Field of Classification Search .......... 438/217, 438/289
    See application file for complete search history.

(56) References Cited

U.S. PATENT DOCUMENTS

| 6,184,094 | B1 | 2/2001 | Goto |
| 6,228,697 | B1 * | 5/2001 | Furukawa et al. ........... 438/228 |
| 6,479,346 | B1 | 11/2002 | Yi et al. |
| 6,569,742 | B1 | 5/2003 | Taniguchi et al. |

FOREIGN PATENT DOCUMENTS

| JP | 8-204022 A | 8/1996 |
| JP | 8-204025 A | 8/1996 |
| JP | 9-45792 A | 2/1997 |
| JP | 11-4004 A | 1/1999 |
| JP | 11-135750 A | 5/1999 |
| JP | 2000-150662 A | 5/2000 |
| JP | 2000-216268 A | 8/2000 |
| JP | 2001-85533 A | 3/2001 |
| KR | 2000-0048212 | 7/2000 |
| KR | 2000-73371 | 12/2000 |

OTHER PUBLICATIONS

Korean Office Action of Corresponding Application No. 10-2005-7009649 dated Oct. 30, 2006.
Chinese Office Action of Corresponding Application No. 038253836 dated Apr. 20, 2007.
Supplemental European Search Report; Application No. 03816642.7-2003/1612861, PCT/JP0304589 dated Aug. 8, 2008.
Japanese Office Action mailed Mar. 17, 2009, issued in corresponding Japanese Application No. 2004-570847.

* cited by examiner

*Primary Examiner*—Thao X Le
*Assistant Examiner*—Kimberly Trice
(74) *Attorney, Agent, or Firm*—Westerman, Hattori, Daniels & Adrian, LLP

(57) ABSTRACT

Multiple kinds of transistors exhibiting desired characteristics are manufactured in fewer processes. A semiconductor device includes an isolation region reaching a first depth, first and second wells of first conductivity type, a first transistor formed in the first well and having a gate insulating film of a first thickness, and a second transistor formed in the second well and having a gate insulating film of a second thickness less than the first thickness. The first well has a first impurity concentration distribution having an extremum maximum value only at the depth equal to or greater than the first depth. The second well has a second impurity concentration distribution which is superposition of the first impurity concentration distribution, and another impurity concentration distribution which shows an extremum maximum value at a second depth less than the first depth, the superposition shows also an extremum maximum value at the second depth.

6 Claims, 26 Drawing Sheets

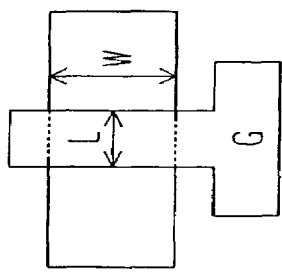
FIG.6A
| N-LV | L/W=0.11/1μm Vt=0.2V |
| N-HV-HVt | L/W=0.70/1μm Vt=0.6V |
| N-HV-LVt | L/W=0.70/1μm Vt=0.2V |
| P-LV | L/W=0.11/1μm Vt=-0.2V |
| P-HV-HVt | L/W=0.70/1μm Vt=-0.6V |
| P-HV-LVt | L/W=0.70/1μm Vt=-0.2V |
FIG.6B
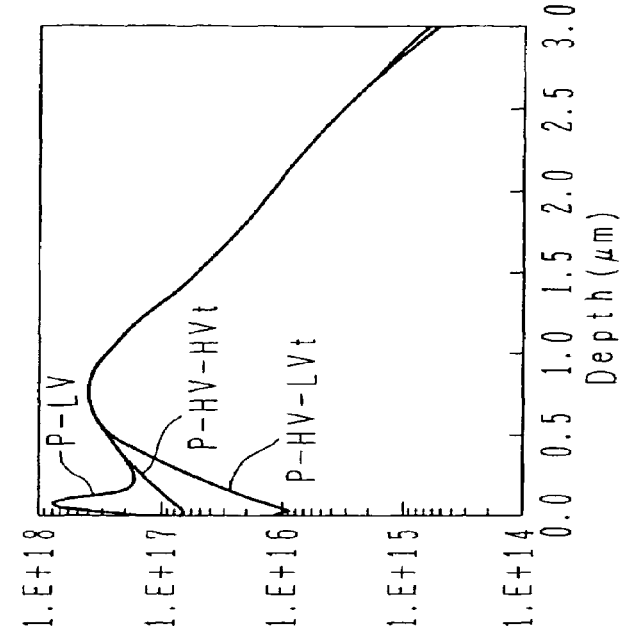
FIG.6D
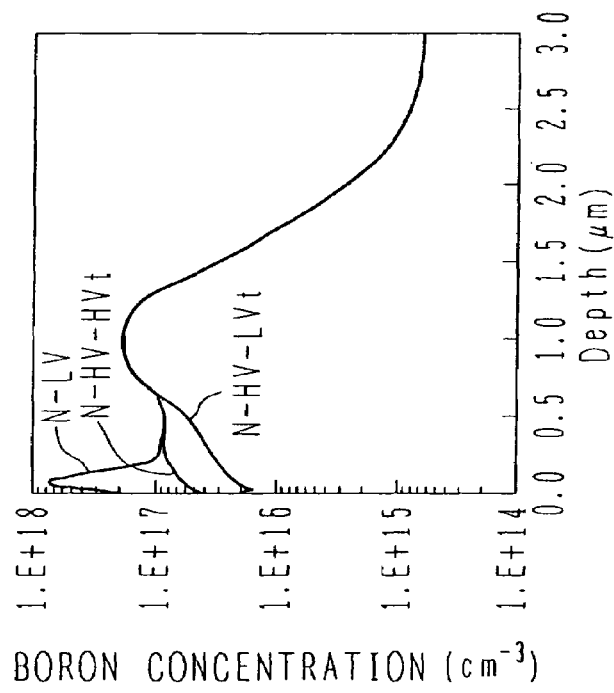
FIG.6C

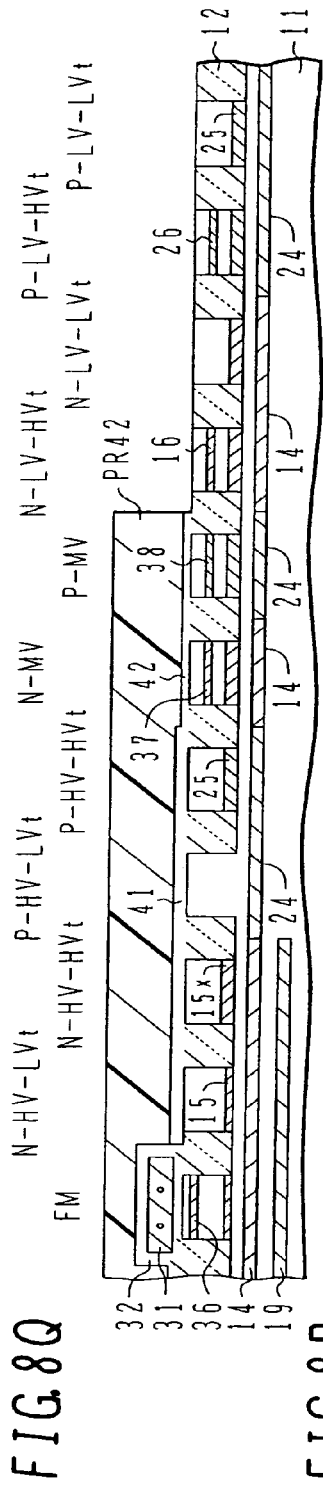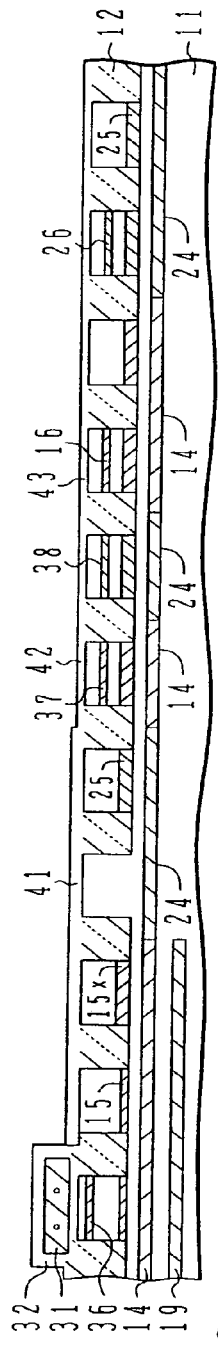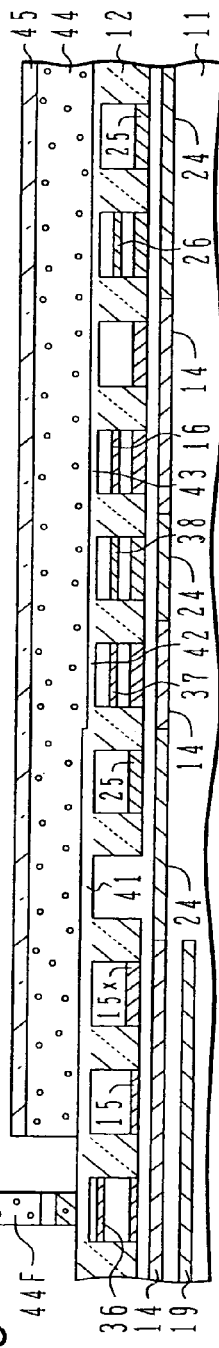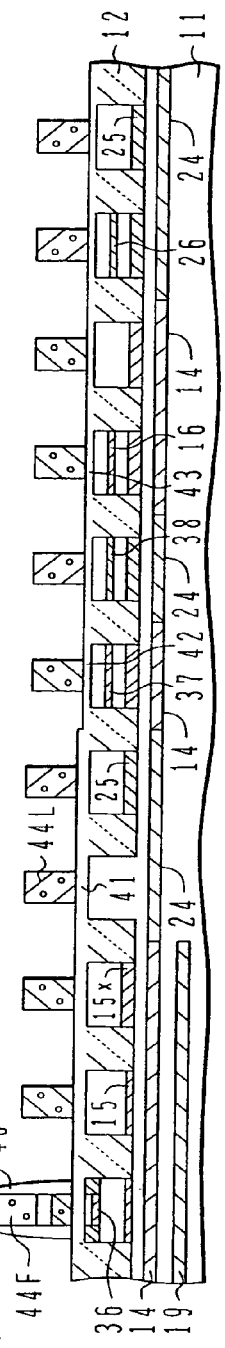

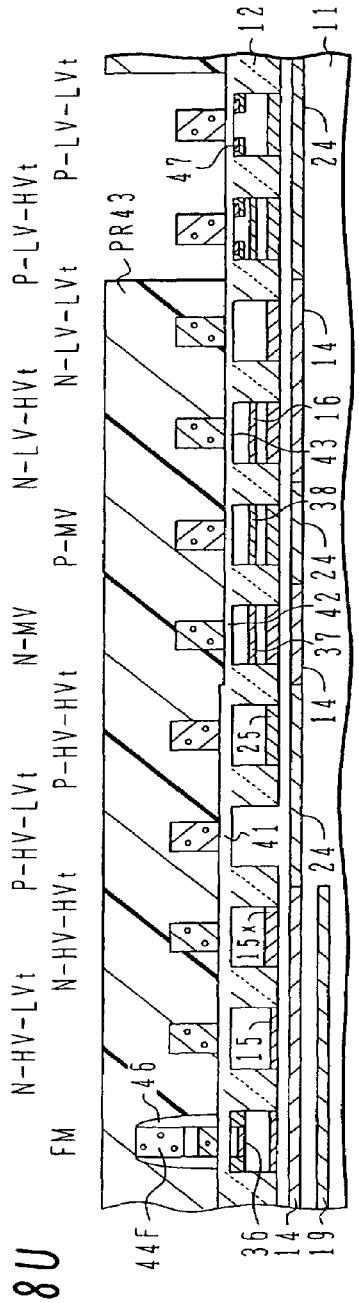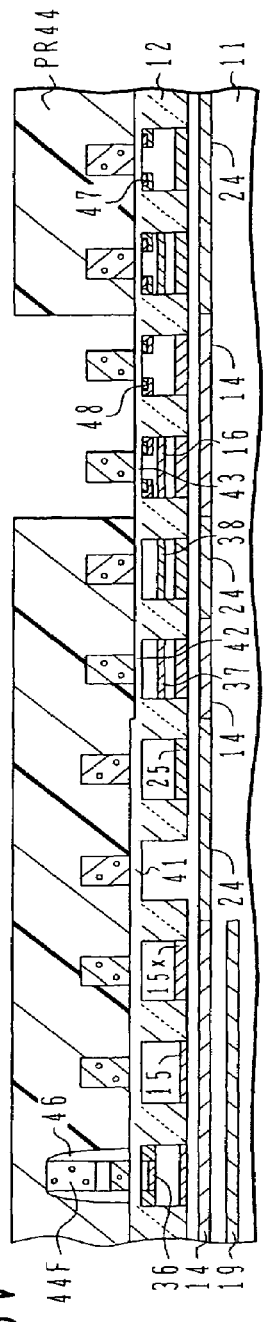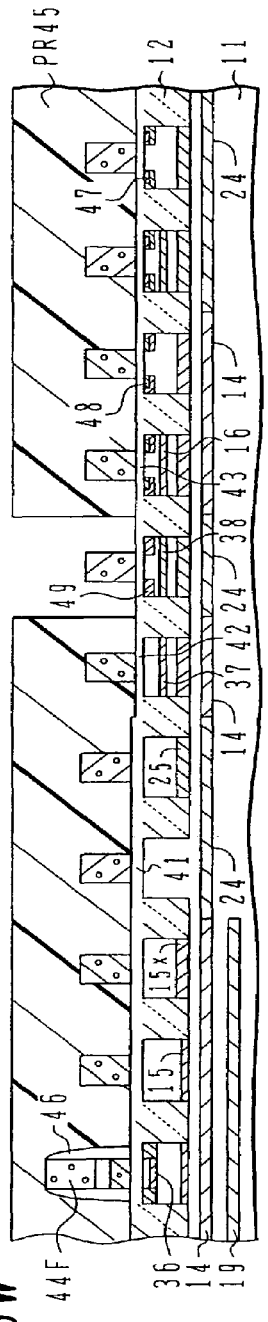

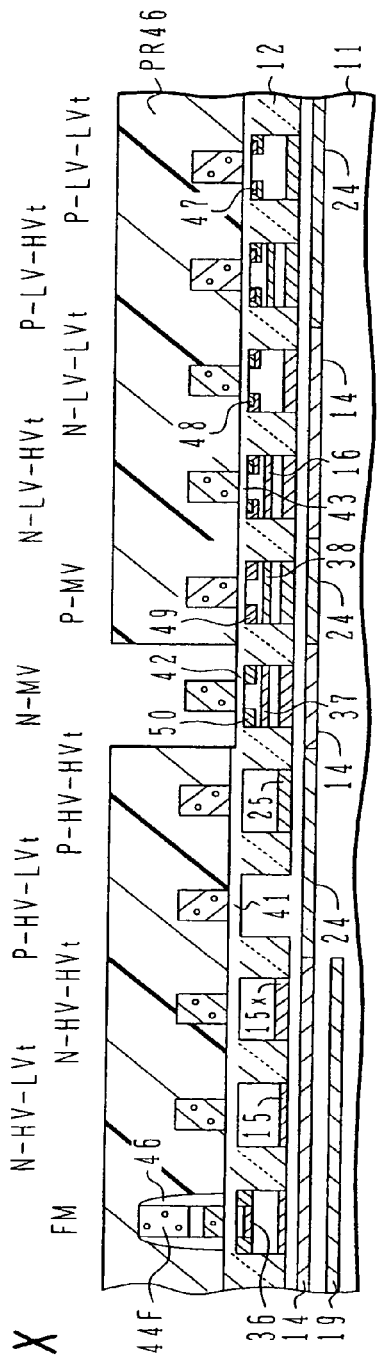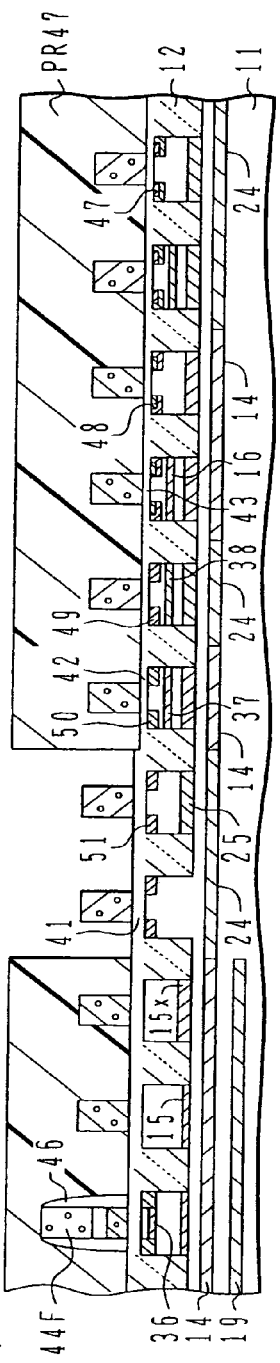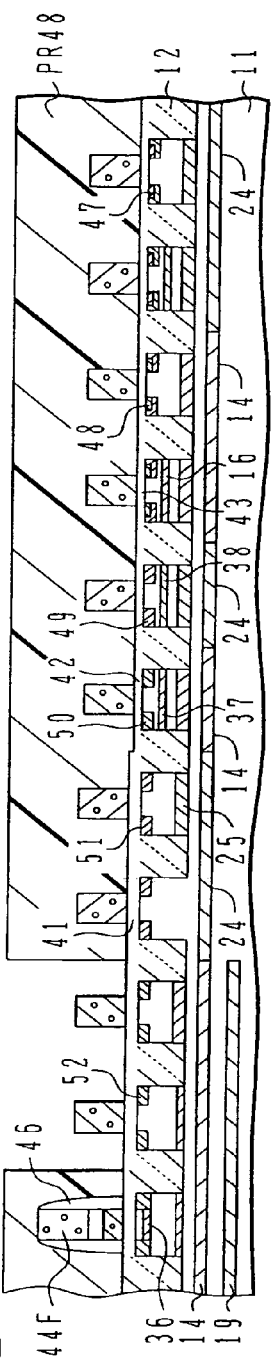

SEMICONDUCTOR DEVICE AND ITS MANUFACTURE METHOD

CROSS REFERENCE TO RELATED APPLICATION

This application is a division of U.S. application Ser. No. 11/168,553, filed on Jun. 29, 2005 which is a continuation application of international patent application of PCT/JP2003/004589 filed on Apr. 10, 2003, the entire contents of which are incorporated herein by reference.

TECHNICAL FIELD

The present invention relates to a semiconductor device and its manufacture method, and more particularly to a semiconductor device operating at a plurality of voltages and its manufacture method.

BACKGROUND ART

As the integration degree of semiconductor integrated circuit devices (IC) becomes high, transistors as IC constituent elements are made very fine. As a transistor becomes very fine, an operation voltage lowers and the gate insulating film becomes thin. In a system on-chip, there are strong needs for mixing a logical circuit operating at a low voltage with a different circuit such as a flash memory circuit including a flash memory driver circuit operating at a high voltage. In order to realize this, it is necessary to integrate the logical circuit of a low voltage operation and the flash memory driver circuit of a high voltage operation on the same semiconductor substrate.

In configuring a CMOS circuit, n-channel transistors operating at high and low voltages and p-channel transistors operating at high and low voltages are formed.

FIGS. 11A to 11F illustrate a typical manufacture method for such a semiconductor device.

As shown in FIG. 11A, a shallow isolation trench (shallow trench isolation: STI) 102 buried with an insulating film is formed in a silicon substrate 101 by well-known processes. In FIG. 11A, four active regions defined by STI are shown. In two active regions on the left side in FIG. 11A, two n-channel MOS transistors N-LV and N-HV are formed having a thin gate insulating film for low voltage (LV) and a thick gate insulating film for high voltage (HV), respectively.

In two active regions on the right side in FIG. 11A, two p-channel MOS transistors P-LV and P-HV are formed having a thin gate insulating film for low voltage (LV) and a thick gate insulating film for high voltage (HV), respectively.

First, a photoresist mask PR51 having an opening corresponding to an n-channel MOS transistor region is formed to perform p-type impurity ion implantation for forming p-type wells WP, p-type impurity ion implantation for forming channel stop regions CSP under the isolation region for isolating semiconductor elements formed in active regions, and p-type ion impurity implantation Vt1 for setting a threshold voltage Vt of the transistor having the thick insulating film to a desired value. The photoresist mask PR51 is thereafter removed.

As shown in FIG. 11B, a photoresist mask PR52 having an opening corresponding to a p-channel MOS transistor region is formed to perform n-type impurity ion implantation for forming n-type wells WN in the p-channel MOS transistor region, n-type impurity ion implantation for forming channel stop regions CSN under the isolation region, and n-type ion impurity implantation Vt2 for setting a threshold voltage Vt of the p-channel MOS transistor having the thick insulating film to a desired value. The photoresist mask PR52 is thereafter removed.

In the above-described ion implantation processes, the threshold voltage control is performed for the transistor regions N-HV and P-HV having the thick gate insulating films. The ion implantation is insufficient for the threshold voltage control in the transistor regions N-LV and P-LV having the thin gate insulating films.

As shown in FIG. 11C, a photoresist mask PR53 having an opening corresponding to the n-channel MOS transistor region N-LV having the thin gate insulating film is formed to perform additional p-type impurity ion implantation Vt3 for adjusting the threshold voltage of the n-channel MOS transistor region N-LV having the thin gate insulating film. The photoresist mask PR53 is thereafter removed.

As shown in FIG. 11D, a photoresist mask PR54 having an opening corresponding to the p-channel MOS transistor region P-LV having the thin gate insulating film is formed to perform additional n-type impurity ion implantation Vt4 for adjusting the threshold voltage of the p-channel MOS transistor region P-LV having the thin gate insulating film. The photoresist mask PR54 is thereafter removed. Next, a thick gate insulating film GI1 is formed on the whole surface of the semiconductor substrate.

As shown in FIG. 11E, a photoresist mask PR55 is formed on the grown gate insulating film, covering the transistor region having the thick gate insulating film and exposing the transistor region having the thin gate insulating film. By using the photoresist mask PR55 as an etching mask, the gate insulating film GI1 is removed. The photoresist mask PR55 is thereafter removed.

As a thin gate insulating film is formed on the semiconductor substrate, a thin gate insulating film GI2 is formed in the region where the thick gate insulating film is removed. In this manner, the thick gate insulating film GI1 and thin gate insulating film GI2 are formed.

As shown in FIG. 11F, a gate electrode layer of polysilicon is formed on the gate insulating film and patterned to form gate electrodes G. By using the gate electrodes as a mask, ion implantation is performed for the extension regions of source/drain regions. After side wall spacers of silicon oxide or the like are formed, ion implantation is performed to form high impurity concentration source/drain regions. Ion implantation processes for the n- and p-channel MOS transistors are selectively executed by using resist masks.

In this manner, a CMOS semiconductor device is formed as shown in FIG. 11F. According to the above-described manufacture method, four masks are used and eight ion implantation processes are executed for forming wells and controlling the threshold voltage Vt excepting the formation of gate insulating films. Complicated manufacture processes result in an increase in manufacture cost and a reduction in manufacture yield. It is desired to simplify the manufacture processes.

Japanese Patent Laid-open Publication No. HEI-11-40004 proposes a semiconductor manufacture method with a reduced number of processes. The semiconductor manufacture method with a reduced number of processes will be described below.

As shown in FIG. 12A, similar to FIG. 11A, four active regions N-LV, N-HV, P-LV and P-HV are defined in a silicon substrate 101 by an isolation region 102. A photoresist mask PR51 having an opening corresponding to an n-channel transistor region is formed, and ion implantation is performed three times to the n-channel MOS transistor region to form p-type wells WP, p-type channel stop regions CSP and p-type threshold voltage adjusting regions VtP.

A concentration of ions to be implanted for adjusting the threshold voltage is set to a value suitable for the transistor N-LV having a thin gate insulating film. This concentration is too high for the impurity ion implantation for adjusting the threshold voltage of an n-channel MOS transistor N-HV having a thick gate insulating film. The photoresist mask PR51 is thereafter removed.

As shown in FIG. 12B, a photoresist mask PR52 having an opening corresponding to a p-channel MOS transistor region is formed, n-type impurity ions are implanted to form n-type wells WN, n-type channel stop regions CSN and n-type threshold voltage adjusting regions VtN, in the p-channel MOS transistor region.

A concentration of ions to be implanted for adjusting the threshold voltage is set to a value suitable for the p-channel MOS transistor P-HV having a thick gate insulating film. This concentration is insufficient for a p-channel MOS transistor P-LV having a thin gate insulating film. The photoresist mask PR52 is thereafter removed.

As shown in FIG. 12C, a photoresist mask PR56 is formed having an opening corresponding to the n-channel MOS transistor region N-HV having the thick gate insulating film and the p-channel MOS transistor region P-LV having the thin gate insulating film, and n-type impurity ions are additionally implanted. With two n-type impurity ion implantation processes, the p-channel MOS transistor region P-LV having the thin gate insulating film has a desired impurity concentration and its threshold voltage is adjusted properly.

In the n-channel MOS transistor region N-HV having the thick gate insulating film, too high the p-type impurity concentration by the first ion implantation is compensated by the additional n-type impurity ion implantation and the impurity concentration lowers. The photoresist mask PR56 is thereafter removed.

As shown in FIG. 12D, a thick gate insulating film GI1 is formed. By using as an etching mask a photoresist mask PR55 covering the transistors having the thick gate insulating film, the thick gate insulating film is removed from the region where a thin gate insulating film is to be formed. The photoresist mask PR55 is thereafter removed, and a thin gate insulating film GI2 is formed.

As shown in FIG. 12E, gate electrodes, source/drain regions and the like are formed by well-known processes to complete a semiconductor device.

With this method, the impurity concentration distributions in the wells are formed by three masking process and seven ion implantation processes, excepting the selective removal of the gate insulating film. As compared with the processes show in FIGS. 11A to 11D, one mask is reduced and one ion implantation process is reduced.

Although the manufacture processes are simplified, the threshold voltage Vt of the n-channel MOS transistor N-HV having the thick gate insulating film is not set independently. Compromise to some degree is necessary for setting the threshold voltage Vt. If a threshold voltage setting is changed at a design stage, threshold voltage settings for other transistors are required to be changed in some cases.

In manufacturing a plurality kind of transistors operating at a number of different operation voltages, the number of processes is likely to increase. New problems are likely to occur if the manufacture method with a reduced number of processes is adopted. A semiconductor device operating at a plurality of operation voltages is desired which can be manufactured by a simplified manufacture method.

DISCLOSURE OF THE INVENTION

An object of this invention is to provide a semiconductor device which can be manufactured with a small number of manufacture processes and has a plurality type of transistors providing desired performances.

Another object of this invention is to provide a manufacture method capable of manufacturing with a small number of processes a semiconductor device having a plurality type of transistors operating at a plurality of operation voltages.

According to one aspect of the present invention, there is provided a semiconductor device comprising: an isolation region formed extending from a surface of a semiconductor substrate to a first depth position; first and second wells of a first conductivity type formed in the semiconductor substrate; a first transistor formed in the first well, the first transistor including a gate insulating film having a first thickness, source/drain regions of a second conductivity type opposite to the first conductivity type, and a gate electrode; and a second transistor formed in the second well, the second transistor including a gate insulating film having a second thickness thinner than the first thickness, source/drain regions of the second conductivity type, and a gate electrode; wherein the first well has a first impurity concentration distribution having a maximum value only at a depth position equal to or deeper than the first depth position, and the second well has a second impurity concentration distribution superposing an impurity concentration distribution same as the first impurity concentration distribution of the first well upon an impurity concentration distribution having a maximum value at a second depth position deeper than the first depth position, the second impurity concentration distribution having the maximum value also at the second depth.

According to another aspect of the present invention, there is provided a manufacture method for a semiconductor device, comprising steps of: (a) forming an isolation region in a semiconductor substrate, the isolation region extending from a surface of the semiconductor substrate to a first depth position; (b) forming first and second wells of a first conductivity type in the semiconductor substrate; (c) forming a gate insulating film having a first thickness on a surface of the first well and forming a gate insulating film having a second thickness thinner than the first thickness on a surface of the second well; (d) forming gate electrodes on the gate insulating films; and (e) forming source/drain regions in the semiconductor substrate on both sides of the gate electrodes, wherein the step (b) comprises steps of: (b1) performing ion implantation commonly to the first and second wells to form a first impurity concentration distribution having a maximum value only at a depth position equal to or deeper than the first depth position; (b2) selectively performing ion implantation to the first and second wells to form a second impurity concentration distribution having a maximum value at a depth position approximately equal to the first depth position; and (b3) performing ion implantation only to the second well to form a third impurity concentration distribution having a maximum value at a depth position shallower than the first depth position.

BRIEF DESCRIPTION OF THE DRAWINGS

FIGS. 6A to 6D are a plan view, a table and graphs showing the structure of each transistor manufactured by the manufacture method shown in FIGS. 5A to 5F.

BEST MODE FOR CARRYING OUT THE INVENTION

Studies will be made on mixture of a logic circuit operating at 1.2 V and a flash memory cell. High voltage is required for programming (write)/erase and read of a flash memory. This high voltage is usually obtained in an internal circuit which raises an externally supplied 1.2 V power supply voltage. In order to generate a high voltage from such a low voltage, a transistor resistant against a high voltage is required. It is desired to provide both a high threshold voltage transistor for suppressing leak and a low threshold voltage transistor for raising voltage efficiently.

Figure 13:
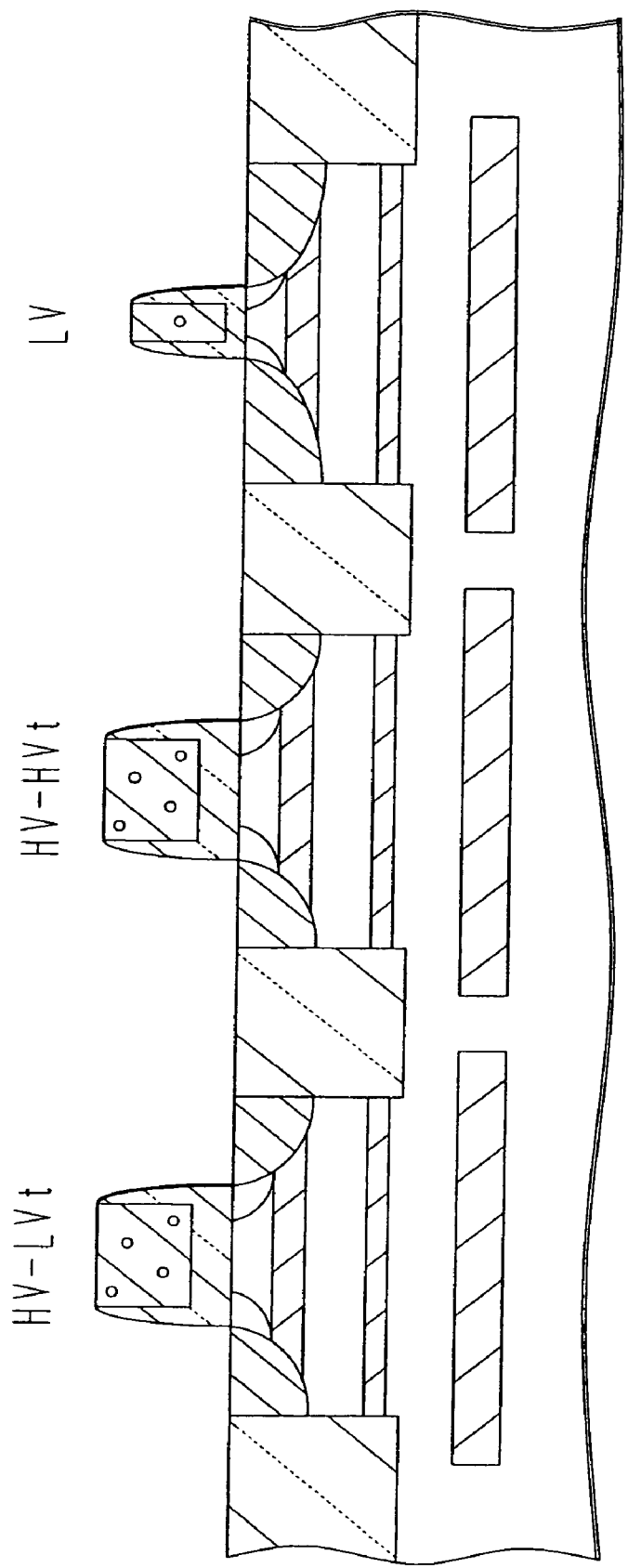
FIG. 13 is a schematic cross sectional view showing the integrated structure of a logic circuit operating at a low voltage and high voltage transistors for driving a flash memory cell.

FIG. 13 shows three types of transistors reflecting such requirements. The transistors include a high voltage, low threshold voltage transistor HV-LVt, a high voltage, high threshold voltage transistor HV-HVt and a low voltage transistor LV. The high voltage transistors HV-LVt and HV-HVt have a gate insulating film of, for example, 16 nm thick. The low voltage transistor LV has a gate oxide film of, for example, 2 nm.

The high voltage transistor is not limited only to a transistor operating at 5 V, but it may be a transistor operating at other drive voltages. For example, for an input/output interface of high voltage, it is desired to use both a high threshold voltage transistor for reducing standby current and a low threshold voltage transistor giving a priority of high speed operation.

A simplified manufacture method is desired which is applicable to an integrated structure of various types of transistors. If an operation voltage is low, e.g., about 1.2 V, an allowable threshold voltage range is very narrow. It is difficult to realize desired performances by a manufacture method unable to set independently the threshold voltage of each transistor. Studies will be made on the manufacture method for three types of transistors such as shown in FIG. 13.

FIGS. 14A to 14D illustrate an example of the most standard manufacture method.

Figure 14A:
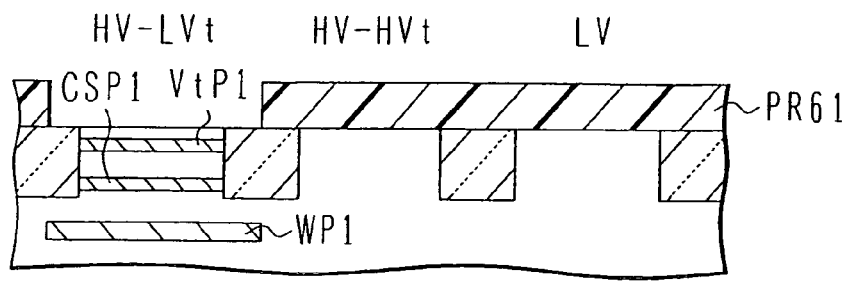
FIGS. 14A to 14D are schematic cross sectional views illustrating an example of a method of manufacturing a plurality type of transistors shown in FIG. 13.

As shown in FIG. 14A, a photoresist mask PR61 is formed exposing an active region where the high voltage, low threshold voltage transistor HV-LVt is to be formed, and p-type impurity ion implantation is performed three times in total: for forming a well WP1, for forming a p-type channel stop region CSP1, and for adjusting a threshold voltage VtP1. The photoresist mask PR61 is thereafter removed.

Figure 14B:
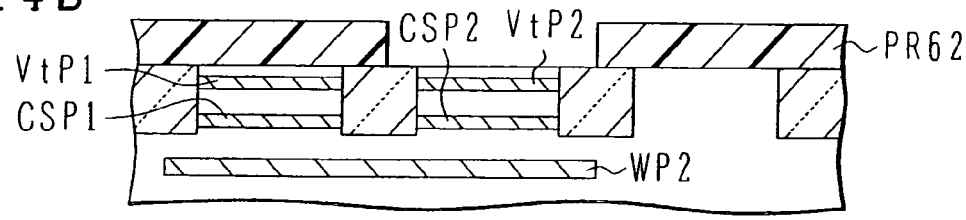

As shown in FIG. 14B, a photoresist mask PR62 is formed having an opening corresponding to a region where the high voltage, high threshold voltage transistor HV-HVt is to be formed, and ion implantation is performed three times: for forming a well WP2, for forming a channel stop region CSP2, and for adjusting a threshold voltage VtP2. The photoresist mask PR62 is thereafter removed.

Figure 14C:
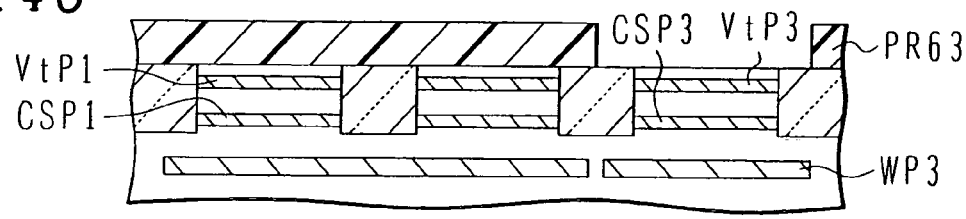

As shown in FIG. 14C, a photoresist mask PR63 is formed exposing a low voltage transistor LV region, and p-type impurity ion implantation is performed for forming a well WP3, for forming a channel stop region CSP3, and for adjusting a threshold voltage VtP3. The photoresist mask PR63 is thereafter removed. Three kinds of ion implantation are performed for each transistor region in this manner, and thereafter, a thick gate oxide film is formed, a portion thereof in the region where a thin gate oxide film is to be formed is removed and a new thin gate oxide film is formed. Thereafter, gate electrodes of polysilicon or the like are formed by ordinary methods.

Figure 14D:
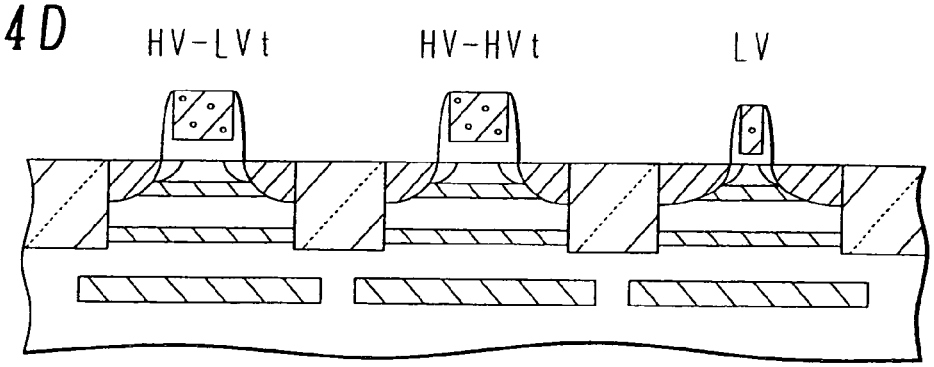

FIG. 14D shows three types of n-channel MOS transistors formed in this manner. In order to form three types of transistors, three masks and nine ion implantation processes are used after the isolation region is formed and before the gate insulating film is formed. It is desired to reduce the number of processes.

Figure 15A:
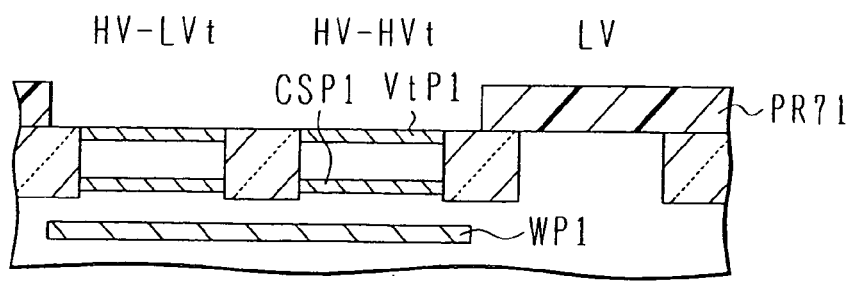
FIGS. 15A to 15C are schematic cross sectional views illustrating another example of a method of manufacturing a plurality type of transistors shown in FIG. 13.
Figure 15B:
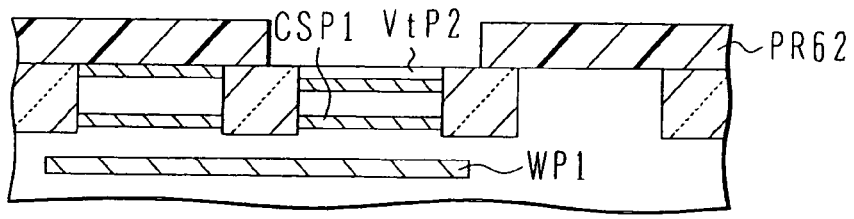
Figure 15C:
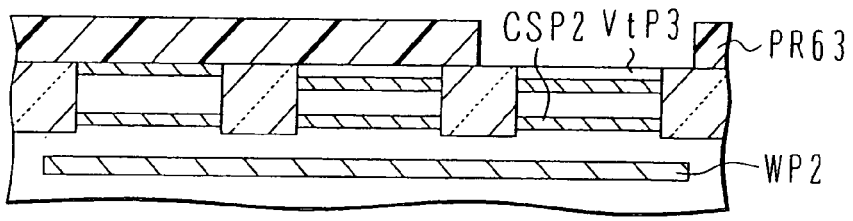

FIG. 15A to 15C illustrate an example of a manufacture method with simplified processes.

As shown in FIG. 15A, a photoresist mask PR71 is formed exposing the region of the high voltage transistors HV-LVt and HV-HVt, and ion implantation is performed three times commonly to the two transistor regions, for forming wells WP1, for forming channel stop regions CSP1, and for forming threshold voltage adjusting regions VtP1.

Threshold voltage adjusting ion implantation is performed at a concentration capable of setting a proper threshold voltage of the high voltage, low threshold voltage transistor HV-LVt. At this concentration, the threshold voltage of the high voltage, high threshold transistor HV-HVt is not proper.

As shown in FIG. 15B, a photoresist mask PR62 is formed which exposes the region of the high voltage, high threshold voltage transistor HV-HVt, and additional ion implantation for threshold adjusting VtP2 is performed. The additional ion implantation raises the threshold voltage to a proper value. The photoresist mask PR62 is thereafter removed.

As shown in FIG. 15C, a photoresist mask PR63 is formed exposing the region of the low voltage transistor LV, and ion implantation is performed three times, for forming a well WP2, for forming a channel stop region CSP2, and for forming a threshold voltage adjusting region VtP3.

With this method, although the number of masks does not change at three, the number of ion implantation processes is reduced by two, to seven.

Figure 16A:
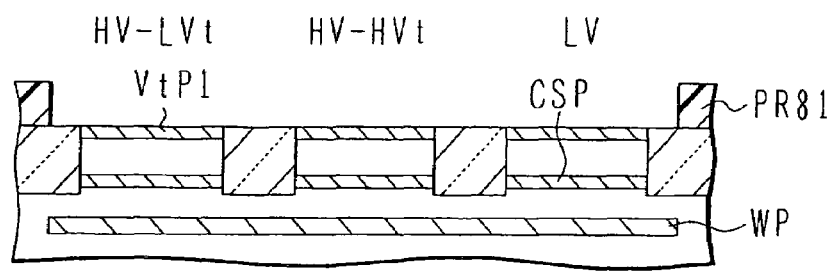
FIGS. 16A to 16C are schematic cross sectional views illustrating still another example of a method of manufacturing a plurality type of transistors shown in FIG. 13.
Figure 16B:
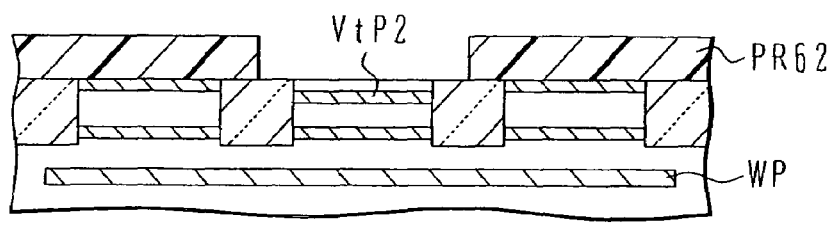
Figure 16C:
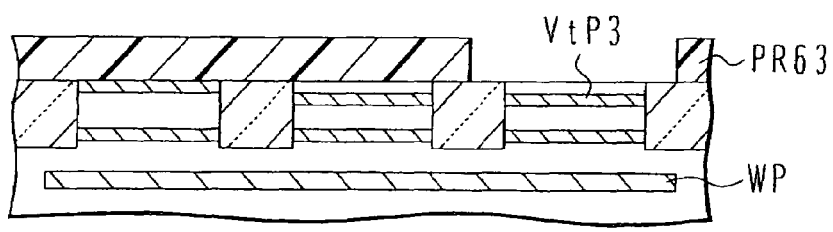

FIG. 16A to 16C illustrate another example of a manufacture method with simplified processes.

As shown in FIG. 16A, a photoresist mask PR81 is formed exposing the regions of three types of transistors, and ion implantation is performed commonly to all transistor regions, for forming wells WP, for forming channel stop regions CSP, and for forming threshold voltage adjusting regions VtP1. The threshold voltage adjusting ion implantation is performed under the conditions adjusted so as to be adapted to the high voltage, low threshold voltage transistor HV-LVt. The photoresist mask PR81 is thereafter removed.

As shown in FIG. 16B, a photoresist mask PR62 is formed having an opening for exposing the region of the high voltage, high threshold voltage transistor HV-HVt, and additional ion implantation is performed for a threshold voltage adjusting region Vtp2. The photoresist mask PR62 is thereafter removed.

As shown in FIG. 16C, a photoresist mask PR63 is formed exposing the region of the low voltage transistor LV, and additional ion implantation is performed for the threshold voltage adjusting region VtP3 of the low voltage transistor.

With this method, although the number of masks does not change at three, the number of ion implantation processes is reduced further by two, to five.

According to the studies by the present inventors, with the method illustrated in FIGS. 16A to 16C, if an ion implantation concentration for the channel stop region is set high in order to raise the threshold voltage of the parasitic transistor of a 1.2 V operating transistor, the concentration of a 5 V operating transistor region becomes too high. It has been found that the high voltage, low threshold voltage transistor HV-LVt cannot be realized. The manufacture method with the smallest number of processes cannot be adopted unless some modification is made.

Embodiments of the present invention will be described with reference to the accompanying drawings.

FIGS. 1A to 1D are cross sectional views illustrating main processes of a semiconductor device manufacture method according to a first embodiment of the present invention.

Figure 1A:
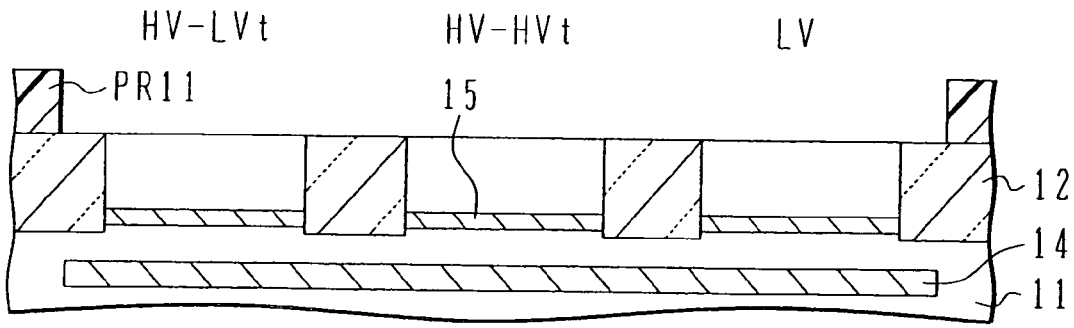
FIGS. 1A to 1D are cross sectional views illustrating main processes of a semiconductor device manufacture method according to an embodiment of the present invention.

As shown in FIG. 1A, in the surface layer of a semiconductor substrate 11, a shallow trench isolation (STI) 12 is formed by a well-known method. STI 12 defines a plurality of active regions. An active region and a transistor formed therein are represented by an identical reference symbol. Ion implantation and an ion implanted region are represented by an identical reference symbol.

In the left active region in FIG. 1A, a high voltage, low threshold voltage transistor HV-LVt is formed. In the middle active region in FIG. 1A, a high voltage, high threshold voltage transistor HV-HVt is formed. In the right active region in FIG. 1A, a low voltage transistor LV is formed.

First, a photoresist mask PR11 is formed having an opening exposing three active regions, and ion implantation 14 and ion implantation 15 are performed. The ion implantation 14 forms wells having an extremum maximum value at a depth position equal to or deeper than that of STI in all three regions. The ion implantation 15 forms channel stop regions having an extremum maximum value at a depth position approximately equal to that of STI. The channel stop region 15 forms a low threshold voltage of the high voltage, low threshold voltage transistor HV-LVt. The photoresist mask PR11 is thereafter removed.

In the drawings, although the peak portion of each impurity concentration is represented by an area, an actual impurity concentration distribution extends in a wider area. Even if the position of the extremum maximum value changes more or less, the operation of the semiconductor device is not influenced in many cases. The terms "equal to" and "approximately equal to" include a range in which the semiconductor device operation can be considered identical.

Figure 1B:
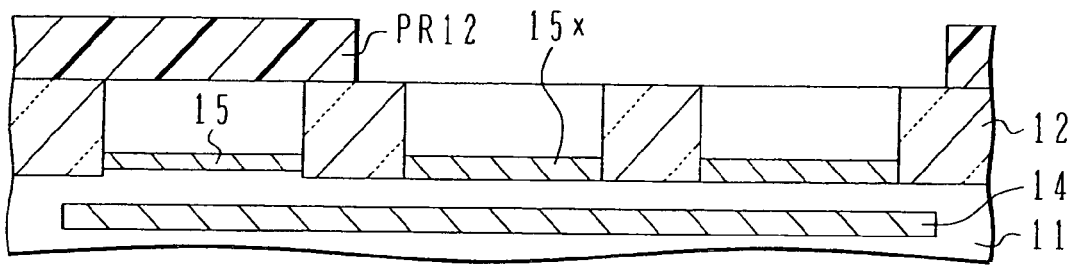

As shown in FIG. 1B, a photoresist mask PR12 is formed having an opening exposing the high voltage, high threshold voltage transistor HV-HVt and low voltage transistor LV, and channel stop regions 15x are formed by performing additional ion implantation at a larger one of doses which achieve threshold voltages of field transistors relative to the high voltage, high threshold voltage transistor HV-HVt and low voltage transistor LV. If the high voltage, high threshold voltage transistor HV-HVt has a threshold voltage of 0.5 V or higher, a dose achieving the former is generally larger and the high voltage, high threshold voltage transistor HV-HVt can be set freely. The photoresist mask PR12 is thereafter removed.

Figure 1C:
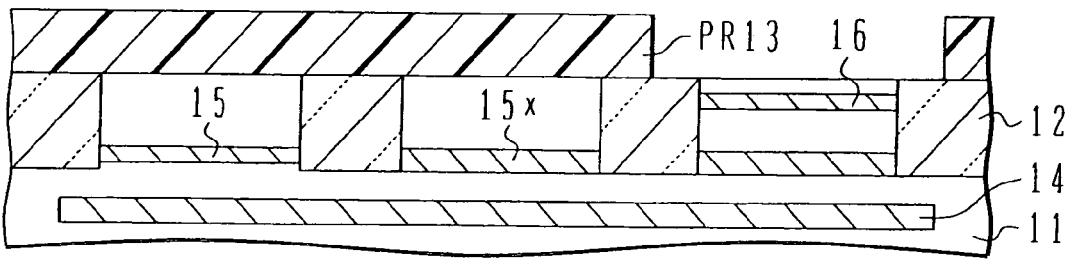

As shown in FIG. 1C, a photoresist pattern PR13 is formed exposing the region of the low voltage transistor LV, and threshold voltage adjusting ion implantation 16 is performed. The photoresist mask PR13 is thereafter removed.

With these processes, the wells of three types of transistors can be formed by using three masks and four ion implantation processes. This method can be applied even to very fine transistors such as low voltage transistors having a gate length of 0.13 □m and an operation voltage of 1.2 V.

An n-channel MOS transistor can be formed by using p-type impurity ion implantation, and a p-channel MOS transistor can be formed by using n-type impurity ion implantation.

Figure 1D:
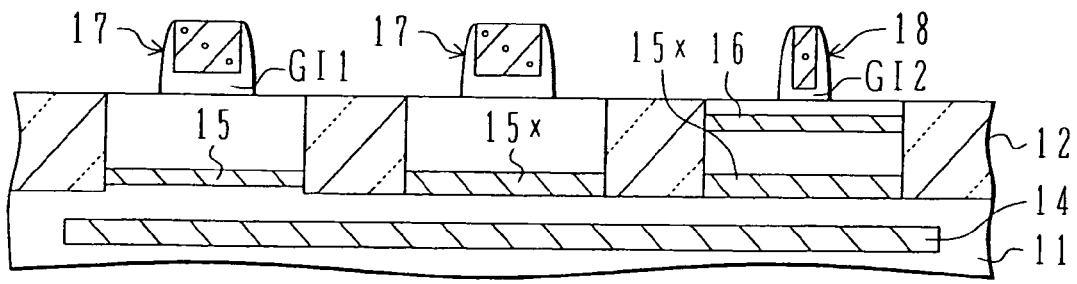

As shown in FIG. 1D, a thick gate oxide film GI1 and a thin gate oxide film GI2 are formed on the surface of the semiconductor substrate by a well-known method. Gate electrodes of polysilicon are formed and after ion implantation for extension regions is performed, side wall spacers are formed and ion implantation for high concentration source/drain regions is performed to complete each transistor. High voltage transistors 17 and a low voltage transistor 18 are therefore formed.

In this embodiment, well ion implantation and channel stop ion implantation are performed commonly to three active regions. If a concentration of well ion implantation is made high and/or if an implantation depth is made shallow, channel stop ion implantation for the high voltage, low threshold voltage transistor may be omitted. FIGS. 2A to 2D illustrate this modification.

Figure 2A:
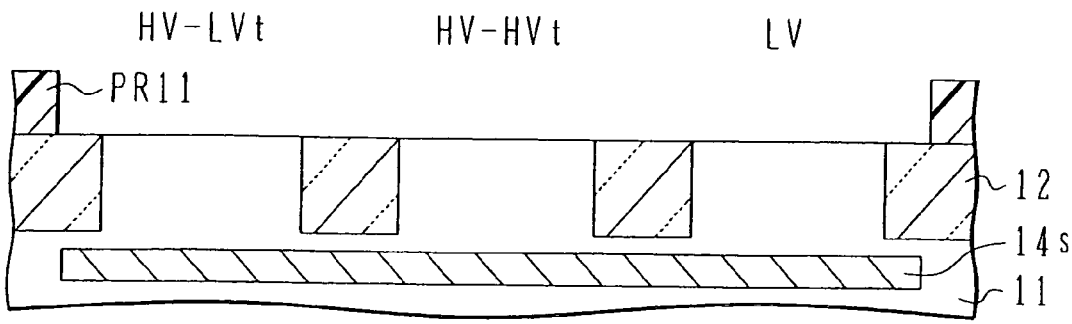
FIGS. 2A to 2D are cross sectional views illustrating a modification of the embodiment.

As shown in FIG. 2A, a photoresist mask PR11 is formed having an opening exposing three active regions, and ion implantation 14s for wells is performed commonly to three active regions. The well ion implantation 14s is shallower and higher in concentration than the well ion implantation 14 shown in FIG. 1A.

This well ion implantation 14s functions as channel stop region ion implantation for the high voltage, low threshold voltage transistor HV-LVt. The photoresist mask PR11 is thereafter removed.

Figure 2B:
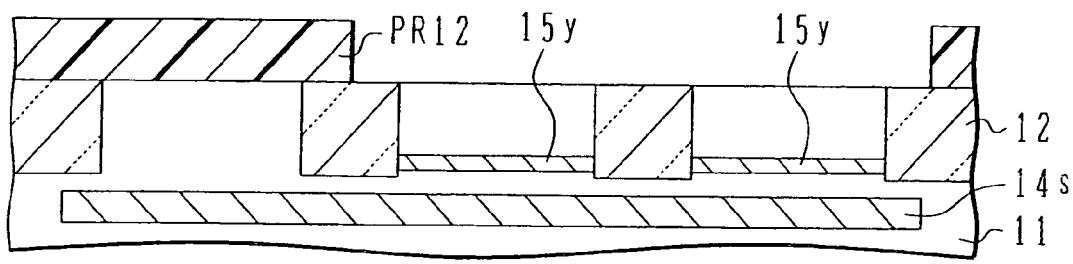

As shown in FIG. 2B, a photoresist mask PR12 is formed having an opening which exposes the high voltage, high threshold voltage transistor HV-HVt and low voltage transistor LV, and channel stop region ion implantation 15y is performed. The photoresist mask PR12 is thereafter removed.

Figure 2C:
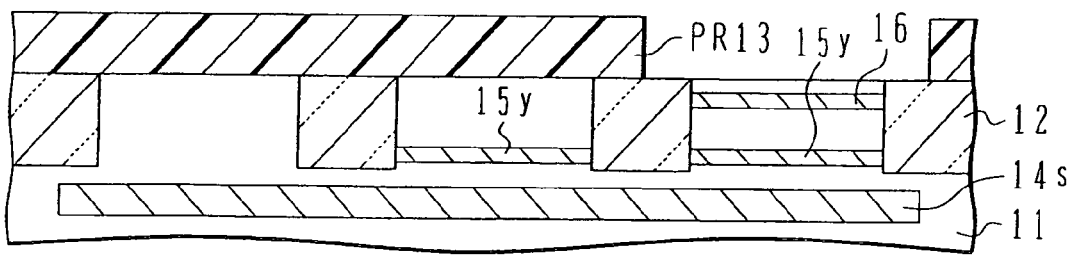

As shown in FIG. 2C, a photoresist pattern PR13 is formed having an opening which exposes the region of the low voltage transistor LV, and threshold voltage adjusting ion implantation 16 is performed. The photoresist mask PR13 is thereafter removed. In this manner, the wells of three types of transistors are formed by using three masks and three ion implantation processes.

Figure 2D:
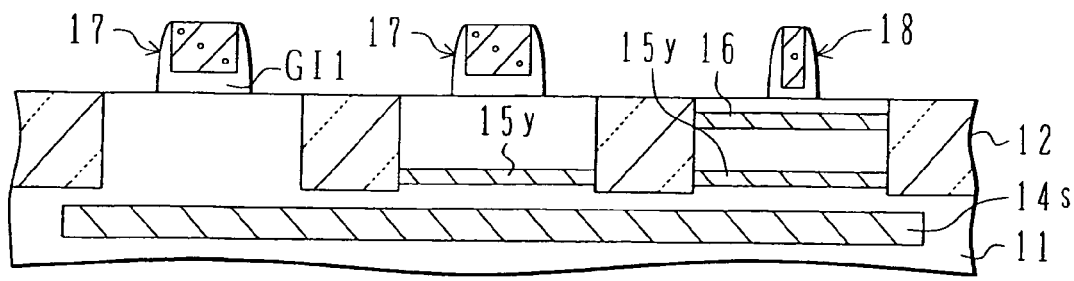

As shown in FIG. 2D, insulated gate electrodes 17 for high voltage and an insulated gate electrode 18 for low voltage are formed by a well-known method.

In a case of integrating a flash memory and a logical circuit, an n-channel high voltage (5 V) transistor may be formed in a triple well in order to deal with negative voltage.

Description will be made on a modification in which an ion implantation process of forming a triple well is added to the processes shown in FIGS. 1A to 1C.

Figure 3A:
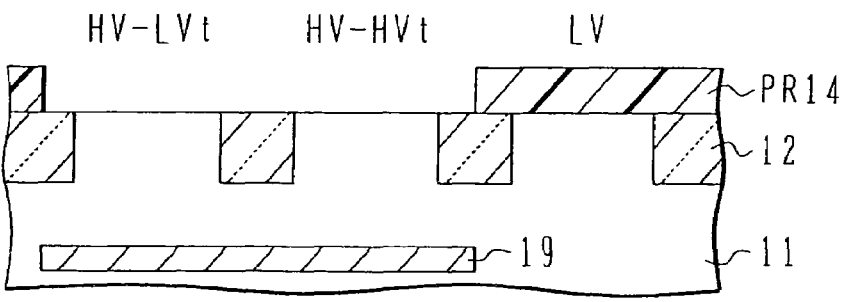
FIGS. 3A to 3E are cross sectional views illustrating another modification of the embodiment.

As shown in FIG. 3A, a photoresist mask PR14 is formed exposing the high voltage transistors HV-LVt and HV-HVt, and n-type impurity ions are implanted to form n-type wells 19 for a triple well. The photoresist mask PR14 is thereafter removed.

Figure 3B:
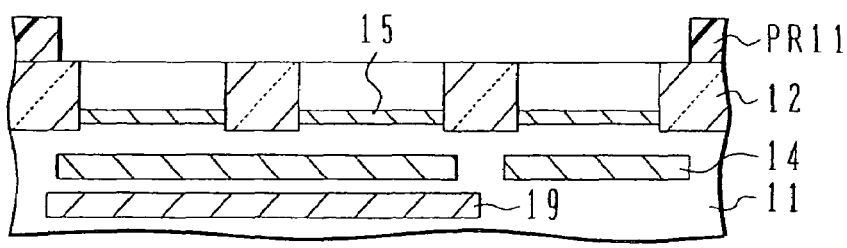

As shown in FIG. 3B, a photoresist mask PR11 is formed having an opening which exposes the regions of three types of transistors, and ion implantation 14 for p-type wells and ion implantation 15 for channel stop regions are performed. The photoresist mask PR11 is thereafter removed.

Figure 3C:
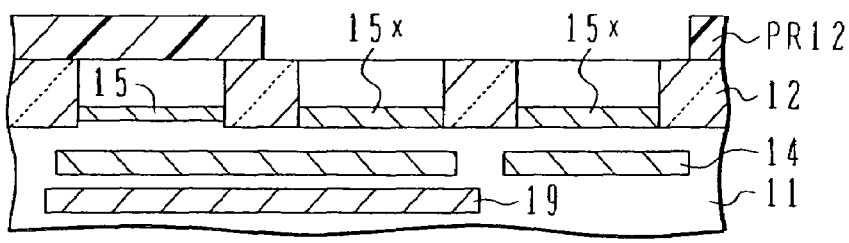

As shown in FIG. 3C, a photoresist pattern PR12 is formed having an opening exposing the regions of the high voltage, high threshold voltage transistor HV-HVt and low voltage transistor LV, and additional ion implantation for channel stop regions is performed. Channel stop regions 15x have a higher impurity concentration than that of the channel region 15. The photoresist mask PR12 is thereafter removed.

Figure 3D:
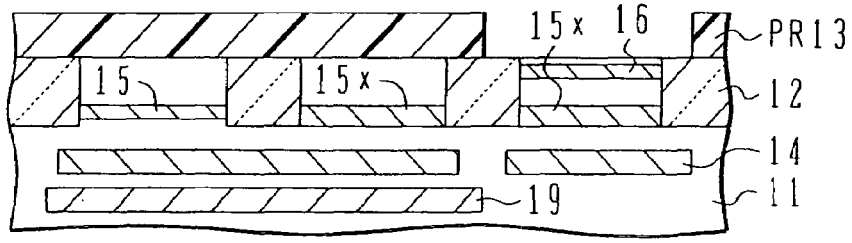

As shown in FIG. 3D, a photoresist pattern PR13 is formed having an opening exposing the region of the low voltage transistor LV, and threshold voltage adjusting ion implantation 16 is performed. The photoresist mask PR13 is thereafter removed.

Figure 3E:
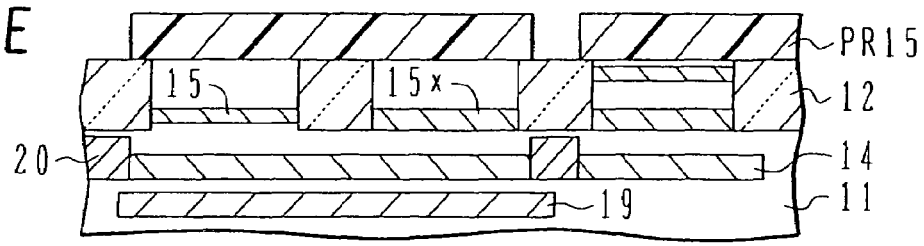

As shown in FIG. 3E, an opening is formed through a photoresist mask PR15 to be used for forming n-type wells for p-channel MOS transistors, in a peripheral area of the n-channel MOS transistor region, in an area contiguous to the already formed n-type wells 19.

As the ion implantation for the n-type wells is performed, n-type regions 20 are formed by this ion implantation in the peripheral area of the n-type wells 19 in the p-channel transistor region. An n-type well for the triple well is therefore formed. In this manner, a semiconductor device having a triple well is formed.

FIGS. 4A to 4D show another modification of the triple well forming process.

Figure 4A:
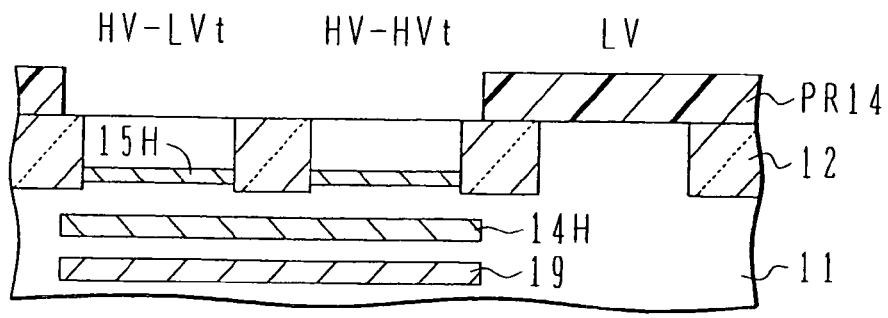
FIGS. 4A to 4D are cross sectional views illustrating still another modification of the embodiment.

As shown in FIG. 4A, a photoresist mask PR14 is formed having an opening exposing the region of the high voltage transistors HV-LVt and HV-HVt, and ion implantation processes are performed for forming n-type wells 19 for a triple well, p-type wells 14H and channel stop regions 15H. The photoresist mask PR14 is thereafter removed.

Figure 4B:
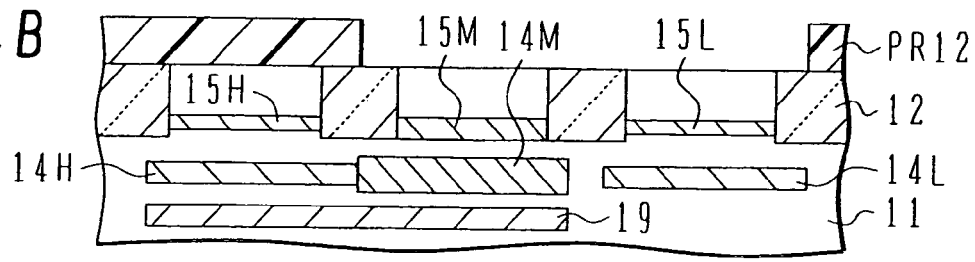

As shown in FIG. 4B, a photoresist mask PR12 is formed having an opening exposing the region of the high voltage, high threshold voltage transistor HV-HVt and low voltage transistor LV, and well region ion implantation 14L and channel stop region ion implantation 15L are performed. The photoresist mask PR12 is thereafter removed.

In the region of the high voltage, high threshold voltage transistor HV-HVt, two well region ion implantation processes are superposed so that a p-type well 14M having a high impurity concentration is formed, and two channel stop region ion implantation processes are superposed so that a channel stop region 15M having a high impurity concentration is formed. In the region of the low voltage transistor LD, only ion implantation processes at this time are used so that a well region 14L having a low impurity concentration and a channel stop region 15L having a low impurity concentration are formed.

Figure 4C:
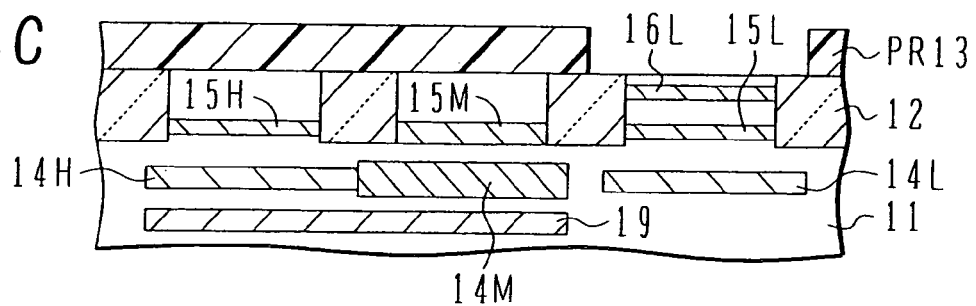

As shown in FIG. 4C, a photoresist mask PR13 is formed having an opening exposing the region of the low voltage transistor LV, and threshold adjusting ion implantation 16L is performed. This threshold adjusting ion implantation is performed only for the region of the low voltage transistor LV.

Figure 4D:
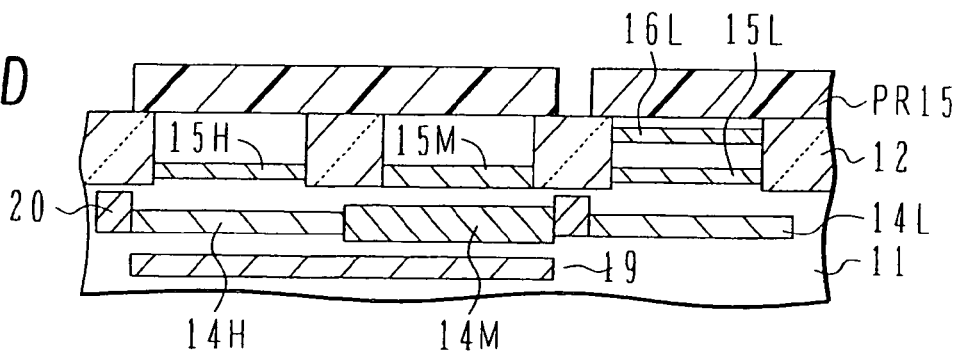

As shown in FIG. 4D, in an n-type well forming process, an opening continuous with the peripheral area of the n-type wells 19 is formed through a photoresist mask PR15 and n-type impurity ion implantation 20 is performed.

In this manner, a semiconductor device having wells of a desired structure can be formed by the number of processes reducing one mask as compared to the processes shown in FIGS. 3A to 3E. Similar manufacture processes can be applied to p-channel MOS transistors by reversing the impurity conductivity type.

Figure 5A:
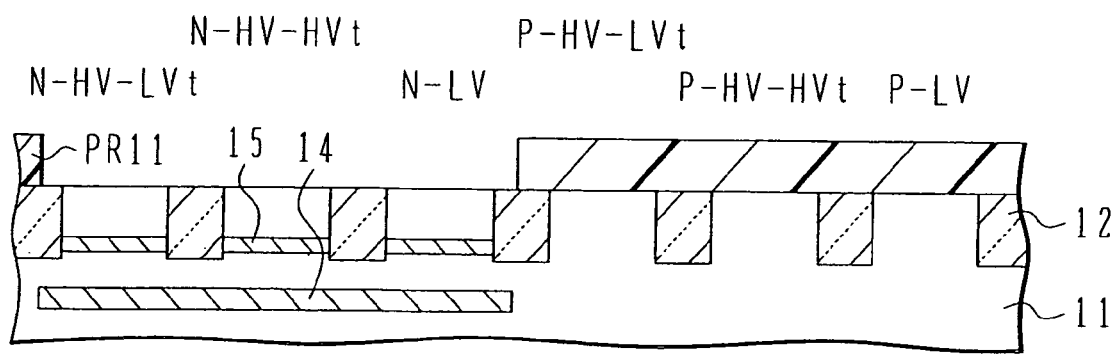
FIGS. 5A to 5F are cross sectional views illustrating main processes of the semiconductor device manufacture method of the embodiment applied to a CMOS semiconductor device manufacture method.

FIG. 5A shows three n-channel transistor regions in the left area and three p-channel transistor regions in the right area. Similar to the manufacture method shown in FIGS. 1A to 1D, a photoresist mask PR11 is formed exposing an n-channel transistor region, and ion implantation processes are performed to form p-type wells 14 and p-type channel stop regions 15.

Ion implantation for the p-type wells is performed, for example, by implanting B$^+$ ions at an acceleration energy of 400 keV and a dose of $1.5 \times 10^{13}$ cm$^{-2}$. Ion implantation for the p-type channel stop regions is performed, for example, by implanting B$^+$ ions at an acceleration energy of 100 keV and a dose of $2 \times 10^{12}$ cm$^{-2}$. The photoresist mask PR11 is thereafter removed.

Figure 5B:
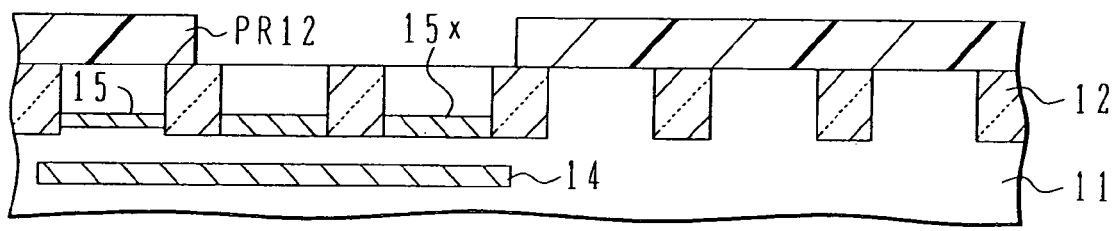

As shown in FIG. 5B, a photoresist mask PR12 is formed having an opening exposing the regions of a high voltage, high threshold voltage n-channel transistor N-HV-HVt and a low voltage transistor N-LV, and additional B$^+$ ion implantation for channel stop regions is performed at an acceleration energy of 100 keV and a dose of $6 \times 10^{12}$ cm$^{-2}$. With this additional ion implantation, channel stop regions 15x having an increased impurity concentration are formed. The photoresist mask PR12 is thereafter removed.

Figure 5C:
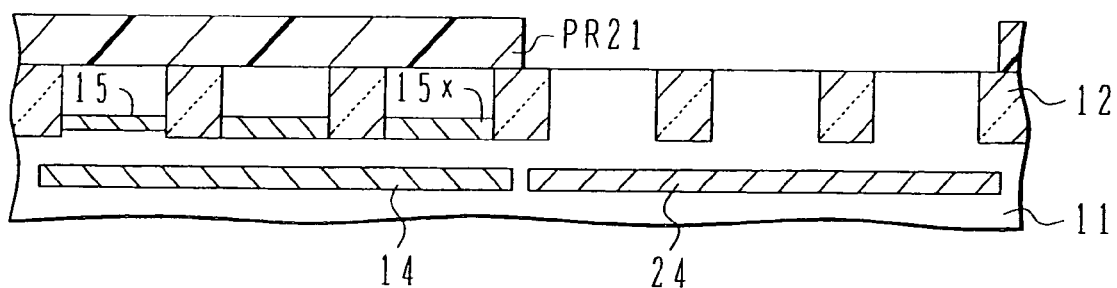

As shown in FIG. 5C, a photoresist mask PR21 is formed exposing a p-channel transistor region, and ion implantation is performed to form n-type wells 24. P$^+$ ions are implanted at an acceleration energy of 600 keV and a dose of $3.0 \times 10^{13}$ cm$^{-2}$. The photoresist mask PR21 is removed thereafter.

Figure 5D:
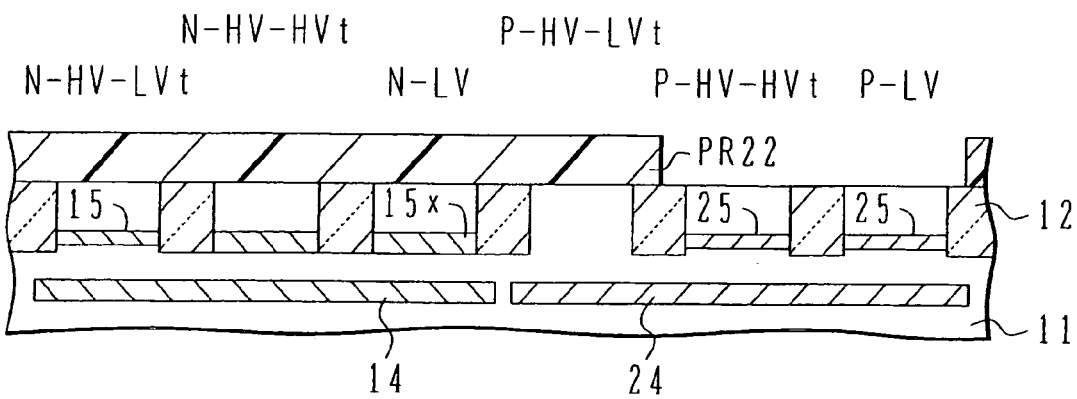

As shown in FIG. 5D, a photoresist mask PR22 is formed having an opening exposing the regions of a high voltage, high threshold voltage p-channel transistor P-HV-HVt and a low voltage p-channel transistor P-LV, and P$^+$ ions for channel stop regions 25 are implanted at an acceleration energy of 240 keV and a dose of $5 \times 10^{12}$ cm$^{-2}$. The photoresist mask PR22 is thereafter removed.

Figure 5E:
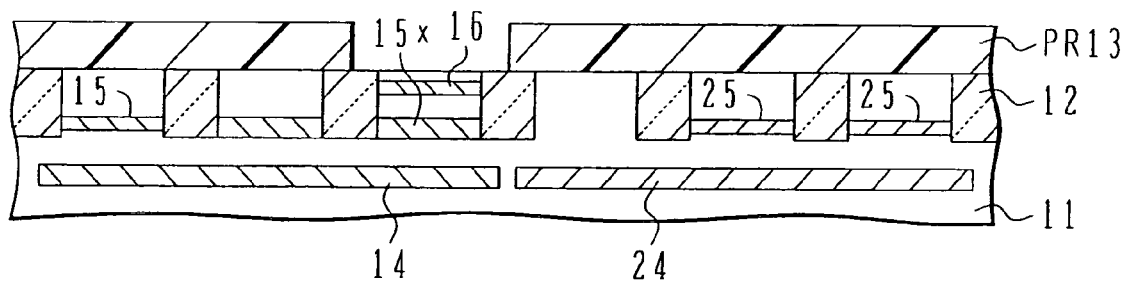

As shown in FIG. 5E, a photoresist mask PR13 is formed having an opening exposing the region of an n-channel low voltage transistor N-LV, and B$_+$ ions as p-type impurities for threshold adjusting are implanted at an acceleration energy of 10 keV and a dose of $4 \times 10^{12}$ cm$^{-2}$. The photoresist mask PR13 is thereafter removed.

Figure 5F:
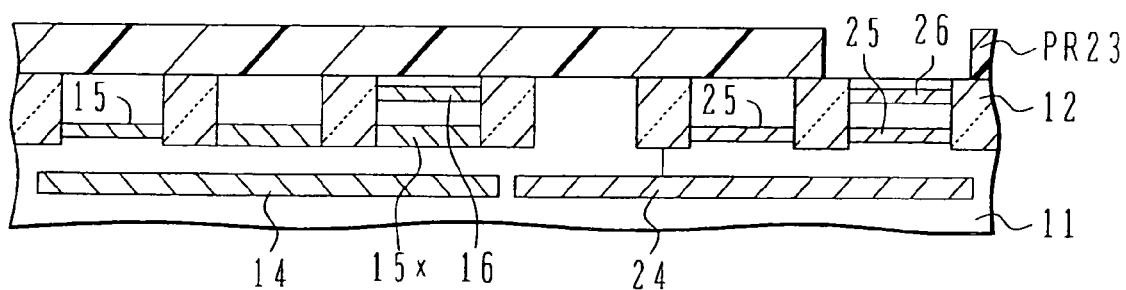

As shown in FIG. 5F, a photoresist mask PR23 is formed having an opening exposing the region of a p-channel low voltage transistor P-LV, and As⁺ ions as n-type impurities for threshold adjusting are implanted at an acceleration energy of 100 keV and a dose of $5\times10^{12}$ cm$^{-2}$. The photoresist mask PR23 is thereafter removed.

As described above, wells for three types of n-channel MOS transistors and three types of p-channel MOS transistors can be formed by using six masks and seven ion implantation processes.

FIGS. 6A to 6D are a plan view, a table and graphs explaining transistors formed by the processes shown in FIGS. 5A to 5F.

FIG. 6A is a schematic diagram showing a plan layout of a transistor. An insulated gate electrode is formed above a rectangular area having a width W. A current direction length (gate length) of the insulated gate electrode G is L.

FIG. 6B is a table showing the characteristics of manufactured transistors. The n-channel low voltage MOS transistor N-LV has a ratio of a gate length L to a gate width, L/W=0.11/1 (□m), and a threshold voltage Vt of 0.2 V. The n-channel high voltage, high threshold voltage MOS transistor N-HV-HVt has a ratio L/W of 0.70/1 (□m) and a threshold voltage of 0.6 V. The n-channel high voltage, low threshold voltage MOS transistor N-HV-LVt has a ratio L/W of 0.70/1 (□m) and a threshold voltage of 0.2 V.

The p-channel low voltage MOS transistor P-LV has a ratio L/W of 0.11/1 (□m) and a threshold voltage Vt of –0.2 V. The p-channel high voltage, high threshold voltage MOS transistor P-HV-HVt has a ratio L/W of 0.70/1 (□m) and a threshold voltage of –0.6 V. The p-channel high voltage, low threshold voltage MOS transistor P-HV-LVt has a ratio L/W of 0.70/1 (□m) and a threshold voltage of –0.2 V.

FIG. 6C shows an impurity concentration distribution of n-channel MOS transistor regions. The abscissa represents a depth from a substrate surface and the ordinate represents a boron concentration. Curves N-LV, N-HV-HVt and N-HV-LVt indicate the impurity concentration distributions of an n-channel low voltage transistor region, an n-channel high voltage, high threshold voltage region and an n-channel high voltage, low threshold voltage region, respectively.

Well ion implantation is common to three types of transistor regions. A concentration of ion implantation for the channel stop regions having a depth generally equal to that of the isolation region, is low corresponding to only one ion implantation process for the n-channel high voltage, low threshold voltage transistor region, and high corresponding to two ion implantation processes for the n-channel high voltage, high threshold voltage transistor region and n-channel low voltage transistor region.

In a shallower region of the substrate, a high p-type concentration peak is formed in the low voltage transistor N-LV region, corresponding to the threshold voltage adjusting ion implantation.

FIG. 6D shows an impurity concentration distribution of p-channel MOS transistor regions. The abscissa represents a depth from a substrate surface and the ordinate represents an n-type impurity concentration. Curves P-LV, P-HV-HVt and P-HV-LVt indicate the impurity concentration distributions of a p-channel low voltage transistor region, a p-channel high voltage, high threshold voltage region and a p-channel high voltage, low threshold voltage region, respectively. Well ion implantation is common to three types of transistor regions.

Ion implantation for the channel stop regions having a depth generally equal to that of the isolation region, is performed only for the high voltage, high threshold voltage transistor region and low voltage transistor regions so that the impurity concentration to the left of the peak is raised. In a shallower region, an n-type impurity peak is formed in the low voltage transistor region by the threshold voltage adjusting ion implantation.

Next, detailed description will be made on 0.13 nm logic processes for a semiconductor device mixing a flash memory.

Figure 7:
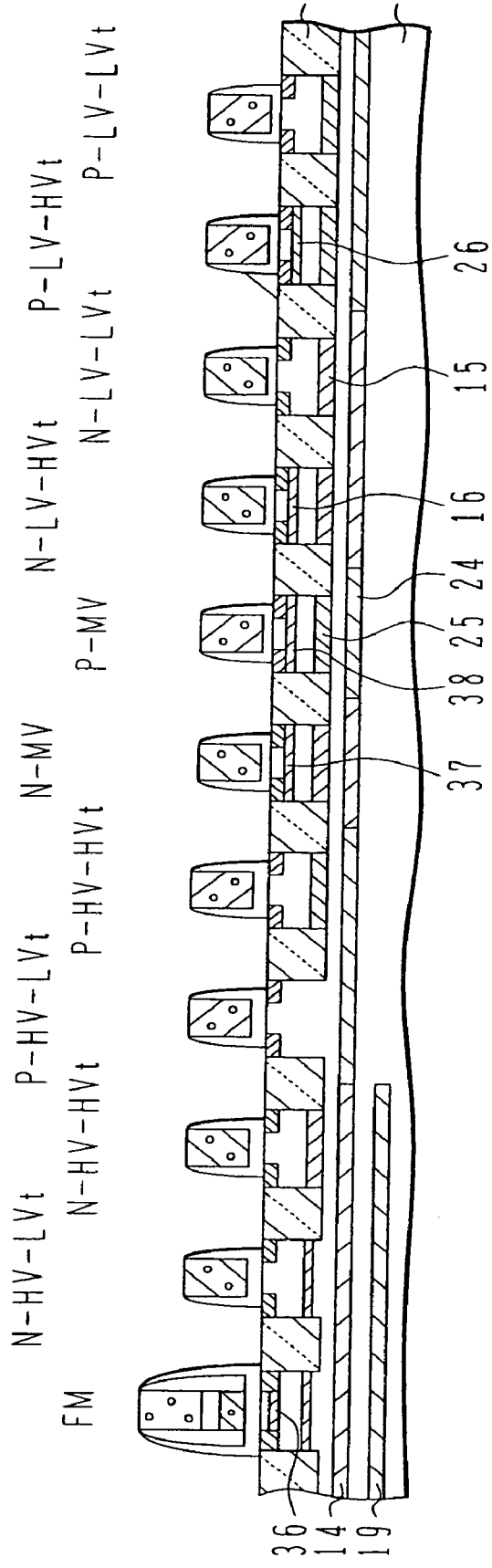
FIG. 7 is a schematic cross sectional view showing the structure of a semiconductor device having more different types of transistors.

FIG. 7 shows a semiconductor device integrating eleven types of transistors. A transistor FM represents a flash memory cell. A high voltage, low threshold voltage transistor N-HV-LVt represents an n-channel MOS transistor having a high breakdown voltage and a low threshold voltage. A high voltage, high threshold voltage transistor N-HV-HVt represents an n-channel MOS transistor having a high breakdown voltage and a high threshold voltage. A high voltage, low threshold voltage transistor P-HV-LVt represents a p-channel MOS transistor having a high breakdown voltage and a low threshold voltage. A high voltage, high threshold voltage transistor P-HV-HVt represents a p-channel MOS transistor having a high breakdown voltage and a high threshold voltage.

A middle voltage transistor N-MV represents a transistor used in an input/output interface, e.g., a 2.5 V operation n-channel MOS transistor. A middle voltage transistor P-MV represents a transistor used in an input/output interface, e.g., a 2.5 V operation p-channel MOS transistor.

A low voltage, high threshold voltage transistor N-LV-HVt represents an n-channel MOS transistor having a low breakdown voltage and a high threshold voltage. A low voltage, low threshold voltage transistor N-LV-LVt represents an n-channel MOS transistor having a low breakdown voltage and a low threshold voltage. A low voltage, high threshold voltage transistor P-LV-HVt represents a p-channel MOS transistor having a low breakdown voltage and a high threshold voltage. A low voltage, low threshold voltage transistor P-LV-LVt represents a p-channel MOS transistor having a low breakdown voltage and a low threshold voltage.

The n-channel high voltage transistors and flash memory are formed in a p-type well 14 in an n-type well 19. The n-channel MOS transistor is formed in the p-type well 14, and the p-channel MOS transistor is formed in an n-type well 24. Channel stop regions 15 and 25 are formed in the transistors other than the high voltage, low threshold voltage p-channel MOS transistor P-HV-LVt.

Threshold voltage adjusting ion implantation regions 16 and 26 are formed in the low voltage, high threshold voltage transistors N-LV-HVt and P-LV-HVt, respectively. Threshold voltage adjusting ion implantation regions 37 and 38 are formed in the middle voltage transistors N-MV and P-MV, respectively. A threshold voltage adjusting ion implantation region 36 is formed in the flash memory FM. The threshold voltage of each transistor is adjusted by corporation of the threshold voltage adjusting ion implantation region and channel stop region.

In the following, description will be made on the processes for manufacturing the semiconductor device shown in FIG. 7.

Figure 8A:
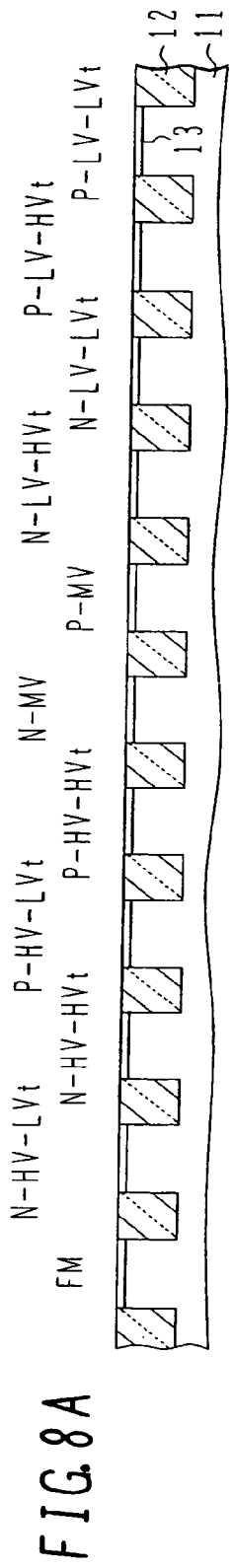
FIGS. 8A to 8ZC are cross sectional views illustrating a manufacture method for the semiconductor device shown in FIG. 7.

As shown in FIG. 8A, after STI 12 is formed in a surface layer of a semiconductor substrate 11, the silicon substrate surface is thermally oxidized to form a silicon oxide film 13 having a thickness of, e.g., 10 nm.

Figure 8B:
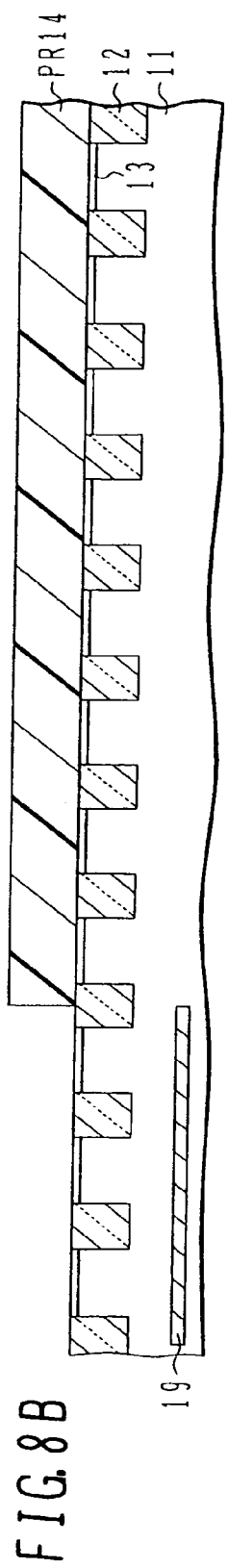

As shown in FIG. 8B, a photoresist mask PR14 is formed exposing the flash memory cell FM and high voltage n-channel MOS transistor N-HV regions, and P⁺ ions for forming n-type wells are implanted at an acceleration energy of 2 MeV and a dose of $2\times10^{13}$ cm$^{-2}$. The resist mask PR14 is thereafter removed.

Figure 8C:
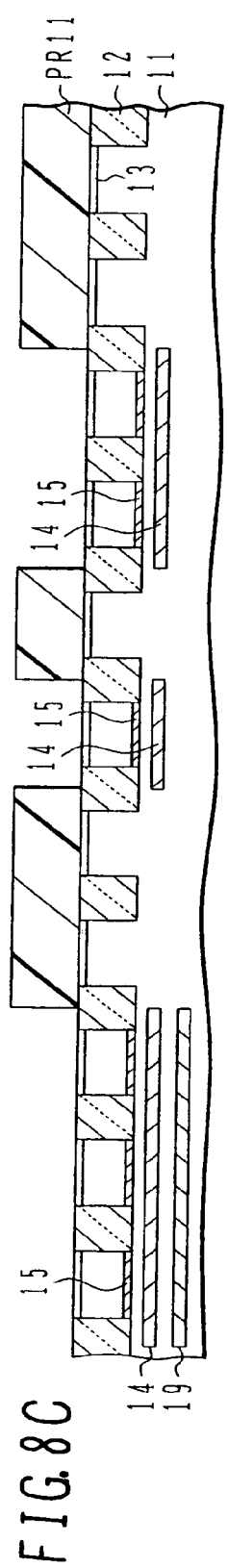

As shown in FIG. 8C, a photoresist mask PR11 is formed having openings exposing the flash memory cell FM and n-channel MOS transistor regions, B⁺ ions for forming p-type wells are implanted at an acceleration energy of 400 keV and a dose of $1.5 \times 10^{13}$ cm$^{-2}$, and B$^+$ ions for forming channel stop regions are implanted at an acceleration energy of 100 keV and a dose of $2 \times 10^{12}$ cm$^{-2}$. The resist mask PR11 is thereafter removed. In this manner, the p-type wells 14 and channel stop regions 15 are formed.

Figure 8D:
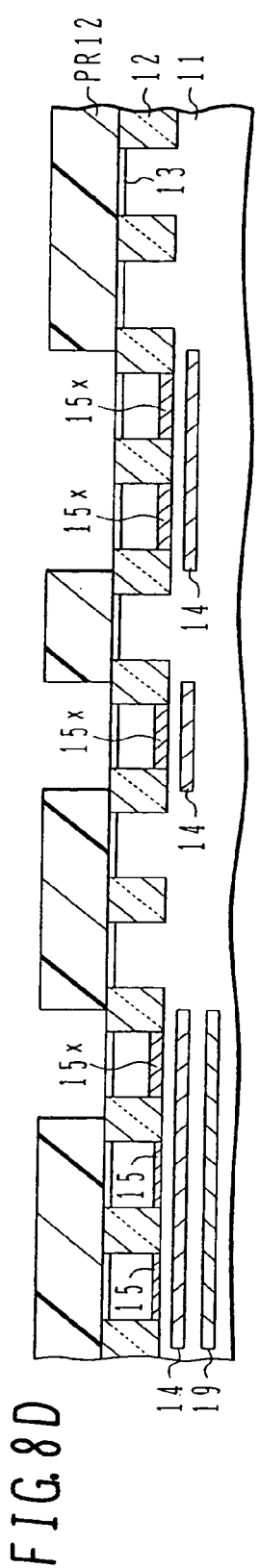

As shown in FIG. 8D, a photoresist mask PR12 is formed exposing the n-channel MOS transistor regions excepting the flash memory FM region and high voltage, low threshold voltage n-channel MOS transistor N-HV-LVt region, and B$^+$ ions for forming channel stop regions are additionally implanted at an acceleration energy of 100 keV and a dose of $6 \times 10^{12}$ cm$^{-2}$. Channel stop regions 15x additionally implanted with ions are therefore formed. The resist mask PR12 is thereafter removed.

Figure 8E:
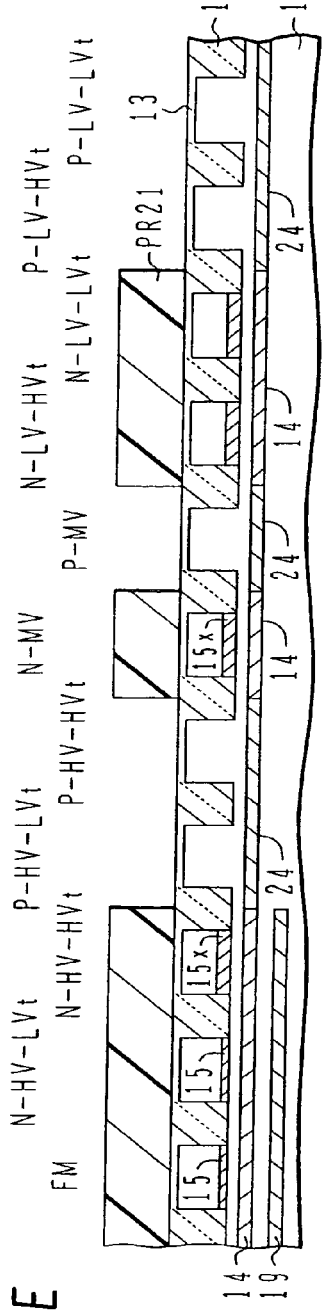

As shown in FIG. 8E, a photoresist mask PR21 is formed exposing the p-channel MOS transistor regions, and P$^+$ ions for forming n-type wells 24 are implanted at an acceleration energy of 600 keV and a dose of $3.0 \times 10^{13}$ cm$^{-2}$. The resist mask PR21 is thereafter removed.

Figure 8F:
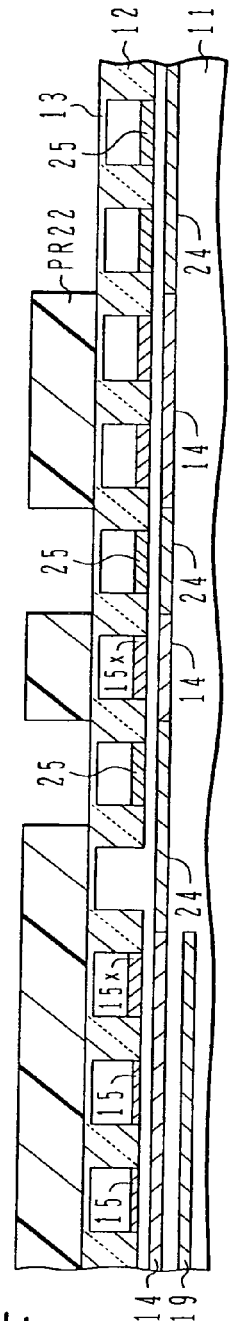

As shown in FIG. 8F, a photoresist mask PR22 is formed exposing the p-channel MOS transistor regions excepting the high voltage, low threshold voltage transistor regions, and P$^+$ ions for forming channel stop regions 25 are implanted at an acceleration energy of 240 keV and a dose of $5.0 \times 10^{12}$ cm$^{-2}$. The resist mask PR22 is thereafter removed.

Figure 8G:
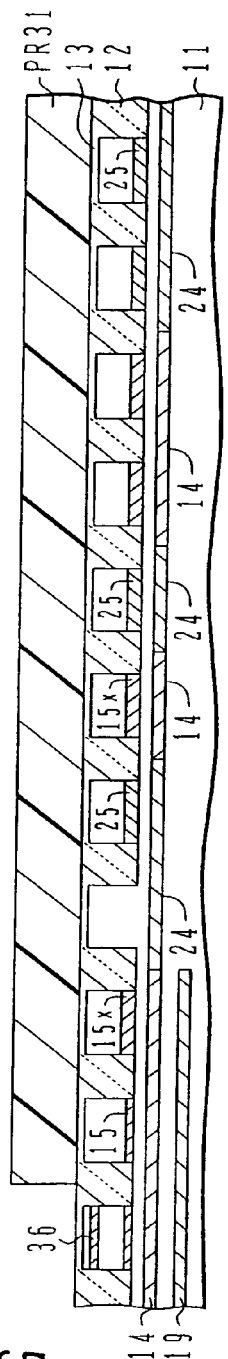

As shown in FIG. 8G, a photoresist mask PR31 is formed exposing the flash memory FM region, and B$^+$ ions for forming a threshold voltage adjustment region 36 are implanted at an acceleration energy of 40 keV and a dose of $6 \times 10^{13}$ cm$^{-2}$. The resist mask PR31 is thereafter removed.

Figure 8H:
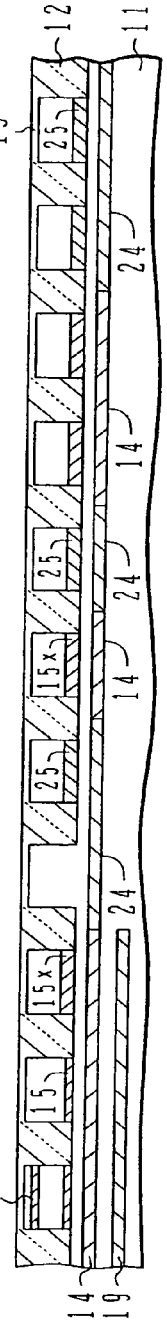

As shown in FIG. 8H, the silicon oxide film 13 on the surface of the semiconductor substrate is removed by HF solution to expose silicon surfaces of the active regions.

Figure 8I:
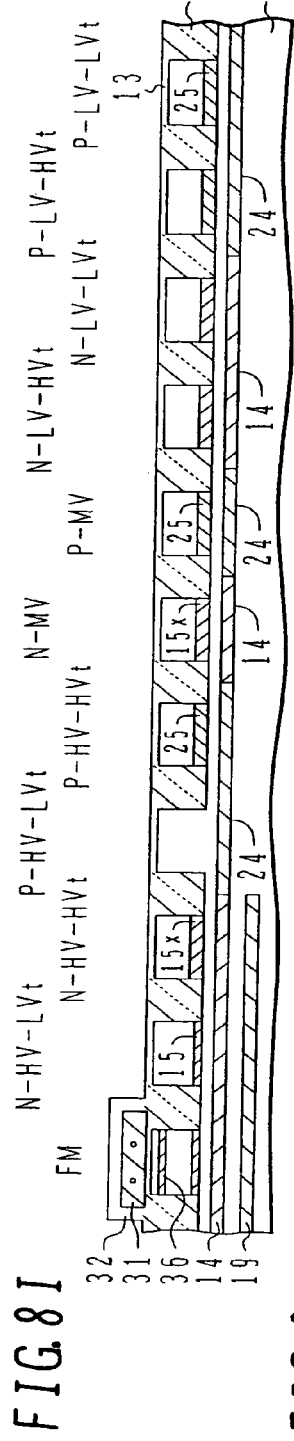

As shown in FIG. 8I, the semiconductor substrate surface is thermally oxidized to grow a tunneling oxide film having a thickness of about 10 nm. On the tunneling oxide film, an amorphous silicon film doped with phosphorus (P) and having a thickness of about 90 nm is deposited and patterned in the shape of a floating gate 31. The amorphous silicon film is transformed into a polysilicon film by a later heat treatment.

A silicon oxide film and a silicon nitride film are deposited to thicknesses of 5 nm and 10 nm, respectively, by CVD, covering the floating gate 31. The surface of the silicon nitride film is thermally oxidized by about 5 nm in thickness to form a silicon oxide film having a thickness of about 10 nm. An ONO film 32 is therefore formed having a total thickness of about 18 nm.

Figure 8J:
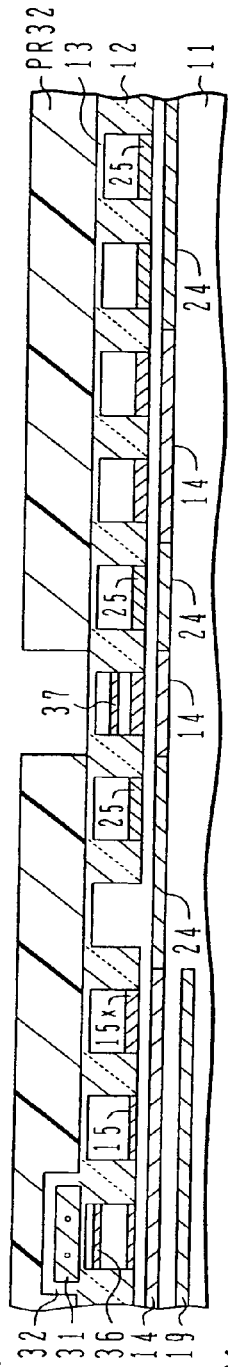

As shown in FIG. 8J, a photoresist mask PR32 is formed exposing the middle voltage n-channel MOS transistor N-MV region, and B$^+$ ions for forming a threshold voltage adjustment region 37 are implanted at an acceleration energy of 30 keV and a dose of $5 \times 10^{12}$ cm$^{-2}$. The resist mask PR32 is thereafter removed.

Figure 8K:
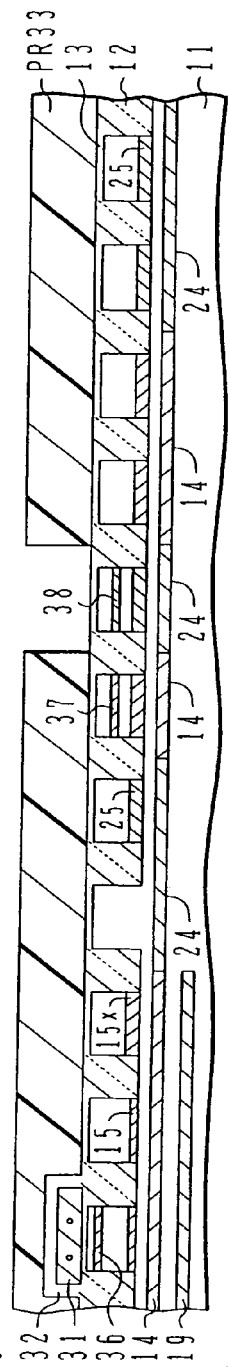

As shown in FIG. 8K, a photoresist mask PR33 is formed exposing the middle voltage p-channel MOS transistor P-MV region, and As$^+$ ions for forming a threshold voltage adjustment region 38 are implanted at an acceleration energy of 150 keV and a dose of $3 \times 10^{12}$ cm$^{-2}$. The resist mask PR33 is thereafter removed.

Figure 8L:
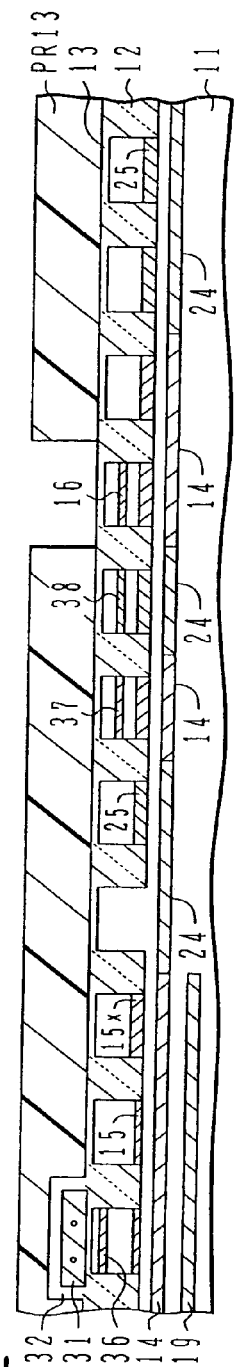

As shown in FIG. 8L, a photoresist mask PR13 is formed exposing the low voltage, high threshold voltage n-channel transistor N-LV-HVt region, and B$^+$ ions for forming a threshold voltage adjustment region 16 are implanted at an acceleration energy of 10 keV and a dose of $5 \times 10^{12}$ cm$^{-2}$. The resist mask PR13 is thereafter removed.

Figure 8M:
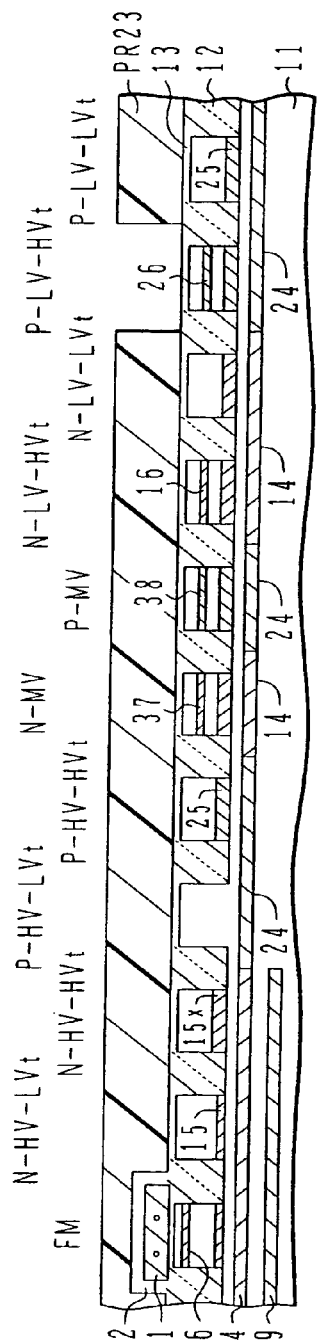

As shown in FIG. 8M, a photoresist mask PR23 is formed exposing the low voltage, high threshold voltage p-channel transistor P-LV-HVt region, and As$^+$ ions for forming a threshold voltage adjustment region 26 are implanted at an acceleration energy of 100 keV and a dose of $5 \times 10^{12}$ cm$^{-2}$. The resist mask PR23 is thereafter removed.

Ion implantation for forming pocket regions is performed by using an extension region forming mask, relative to the low voltage transistor regions. The conditions of this ion implantation also controls the threshold voltage. Although the threshold voltage control ion implantation is not performed for the low voltage, low threshold voltage transistor regions, their threshold voltages are about 0.1 V due to the pocket region forming ion implantation. Similarly, the threshold voltages of the low voltage, high threshold voltage transistors are about 0.2 V.

Figure 8N:
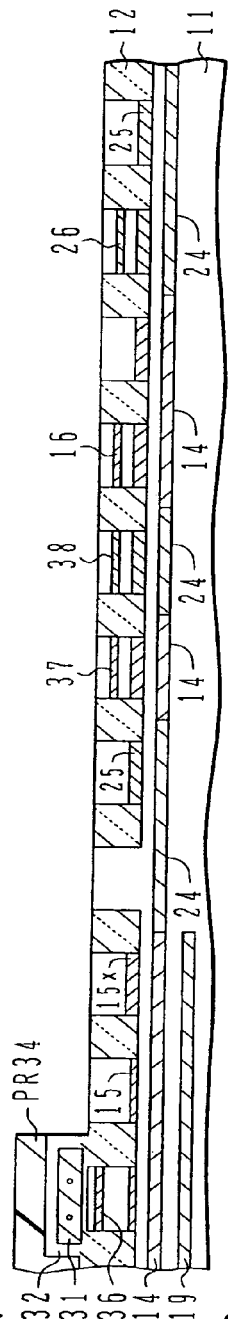

As shown in FIG. 8N, a photoresist mask PR34 is formed covering the flash memory FM region, and the ONO film 32 other than in the FM region is removed. The resist mask PR34 is thereafter removed.

Figure 8O:
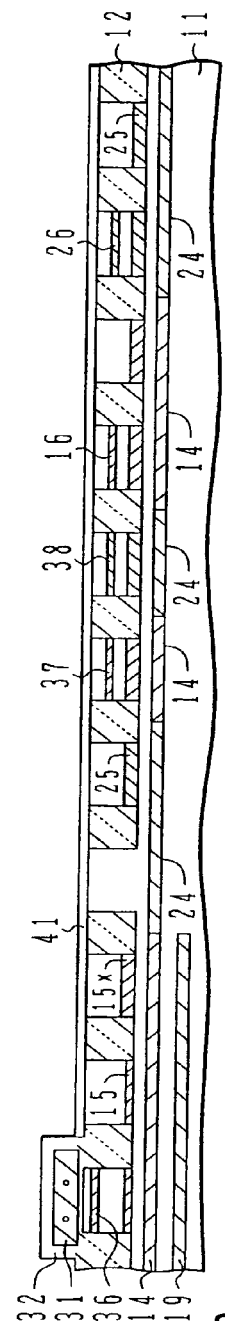

As shown in FIG. 8O, the substrate surface is thermally oxidized to form a silicon oxide film 41 having a thickness of 13 nm.

Figure 8P:
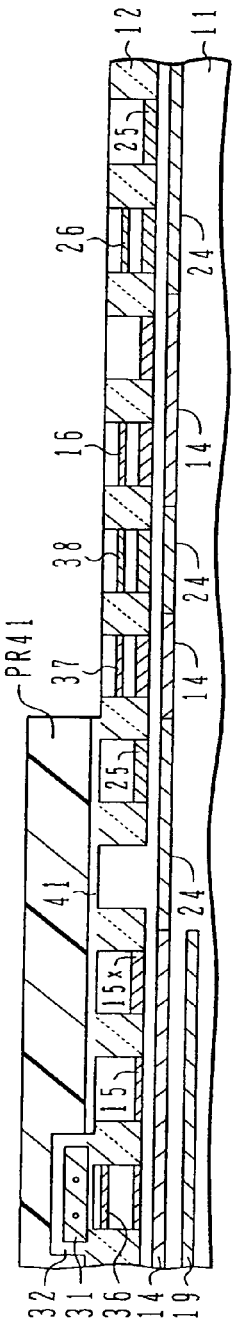

As shown in FIG. 8P, a resist mask PR41 is formed covering the flash memory cell region and high voltage transistor regions, and the silicon oxide film 41 in the exposed region is removed. The resist mask PR41 is thereafter removed.

As shown in FIG. 8Q, on the exposed substrate surface, a silicon oxide film 42 having a thickness of 4.5 nm is formed by thermal oxidation. By using a resist mask PR42, the thermally oxidized film 42 in the low voltage transistor region is removed.

As shown in FIG. 8R, on the exposed substrate surface, a silicon oxide film 43 having a thickness of, e.g., 2.2 nm, is formed by thermal oxidation.

As shown in FIG. 8S, on the surface of the substrate having three types of the gate insulating films, a polysilicon film having a thickness of 180 nm is formed by CVD, and a silicon nitride film having a thickness of 30 nm is deposited on the polysilicon film by plasma CVD. The silicon nitride film functions as an antireflection film and can also be used as an etching mask and blocking mask for oxidation after flash gate formation. A gate electrode 44F of the flash memory is patterned by photolithography and etching.

As shown in FIG. 8T, the side walls of the gate electrode of the flash memory are thermally oxidized, and ion implantation is performed to form source/drain regions. An insulating film such as a silicon nitride film is formed by thermal CVD, covering the gate electrode of the flash memory, and side wall spacers 46 of silicon nitride are formed on the side walls of the gate electrode by reactive ion etching (RIE). The silicon nitride film on the polysilicon film is removed during RIE. Thereafter, gate electrodes 44L of the transistors in the logical circuit area are formed.

As shown in FIG. 8U, a resist mask PR43 is formed exposing the low voltage p-channel MOS transistor region, and B$^+$ ions for forming source/drain extension regions are implanted at an acceleration energy of 0.5 keV and a dose of $3.6 \times 10^{12}$ cm$^{-2}$. By using the same resist mask, As$^+$ ions for forming pocket regions are implanted along four directions tilted by 28 degrees from the substrate normal at an acceleration energy of 80 keV and each dose of $6.5 \times 10^{12}$ cm$^{-2} \times 4$.

The extension regions 47 with pocket regions are therefore formed. Either the extension region or the pocket region may be formed first. The resist mask PR43 is thereafter removed.

Figure 9A:
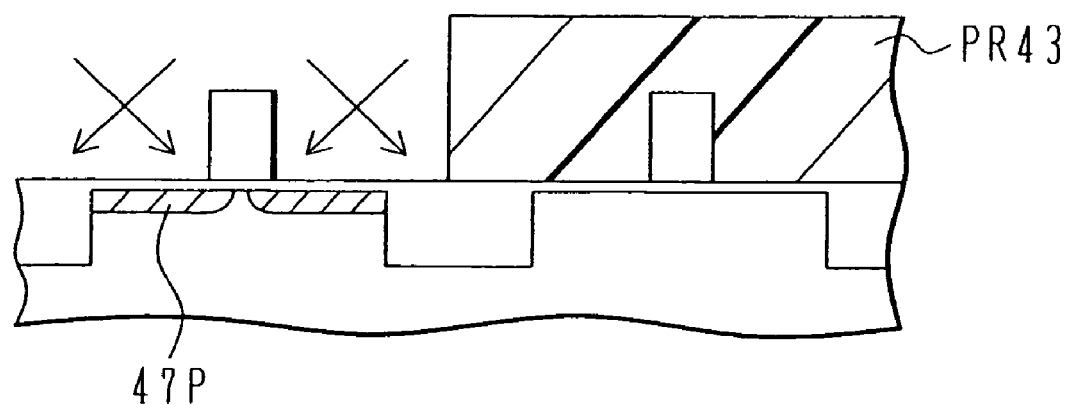
FIGS. 9A and 9B are cross sectional views illustrating a process of forming pocket regions.

The pocket region forming process will be described more in detail with reference to FIGS. 9A and 9B. A resist mask PR43 exposes the low voltage transistor region. Impurity ions are implanted into the surface layer of the substrate along directions tilted by a predetermined angle from a substrate normal direction. Pocket regions 47P are formed in this manner. The pocket regions 47P have a conductivity type opposite to that of the source/drain regions.

Figure 9B:
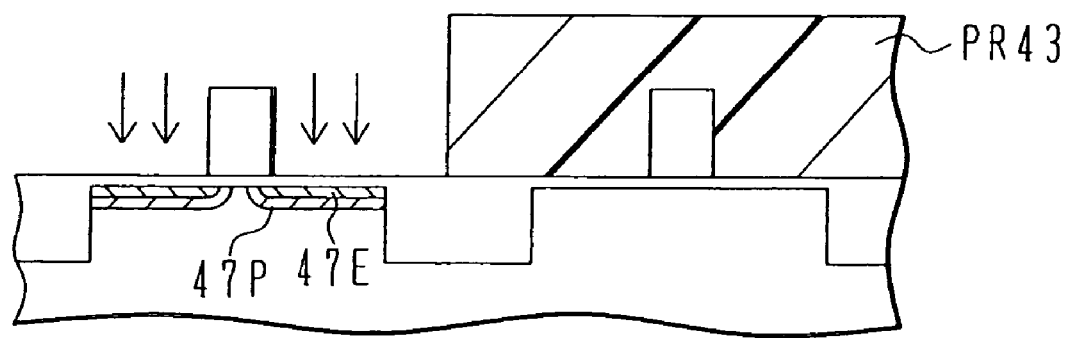

As shown in FIG. 9B, ion implantation is performed along the substrate normal direction to form extension regions 47E having the same conductivity type as that of the high concentration source/drain regions. The extension region 47E has a shape that at least its top end portion is surrounded by the pocket region 47P. By forming the opposite conductivity type pocket regions, punch-through can be prevented and the transistor threshold voltage can be adjusted.

As shown in FIG. 8V, a resist mask PR44 is formed exposing the low voltage n-channel MOS transistor region, and ion implantation processes are performed relative to the low voltage n-channel MOS transistor region to form extension regions and pocket regions.

For example, for the extension regions, $As^+$ ions are implanted at an acceleration energy of 3 keV and a dose of $1.1 \times 10^{15}$ cm$^{-2}$, and for the pocket regions, $BF_2^+$ ions are implanted along four directions tilted by 28 degrees from the substrate normal direction at an acceleration energy of 35 keV and a dose of $9.5 \times 10^{12}$ cm$^{-2} \times 4$. In this manner, the extension regions 48 with the pocket regions are formed. The resist mask PR44 is thereafter removed.

As shown in FIG. 8W, a resist mask PR45 is formed exposing the middle voltage p-channel MOS transistor P-MV region, and $BF_2^+$ ions are implanted at an acceleration energy of 10 keV and a dose of $7.0 \times 10^{13}$ cm$^{-2}$ to form extension regions 49. The resist mask PR45 is thereafter removed.

As shown in FIG. 8X, a resist mask PR46 is formed exposing the middle voltage n-channel MOS transistor N-MV region, $P^+$ ions are implanted at an acceleration energy of 10 keV and a dose of $3.0 \times 10^{13}$ cm$^{-2}$ to form extension regions 50, and $As^+$ ions are implanted at an acceleration energy of 10 keV and a dose of $2.0 \times 10^{13}$ cm$^{-2}$. $As^+$ ions are additionally implanted in order to increase source-drain current Ids. P has also a function of improving hot carrier resistance. If As ion implantation is not performed, parasitic resistance increases and Ids reduces by about 10%. The resist mask PR46 is thereafter removed.

As shown in FIG. 8Y, a resist mask PR47 is formed exposing the high voltage p-channel MOS transistor P-HV region, and $BF_2$ ions are implanted at an acceleration energy of 80 keV and a dose of $4.5 \times 10^{13}$ cm$^{-2}$ to form extension regions 51. The resist mask PR47 is thereafter removed.

Figure 8Z:
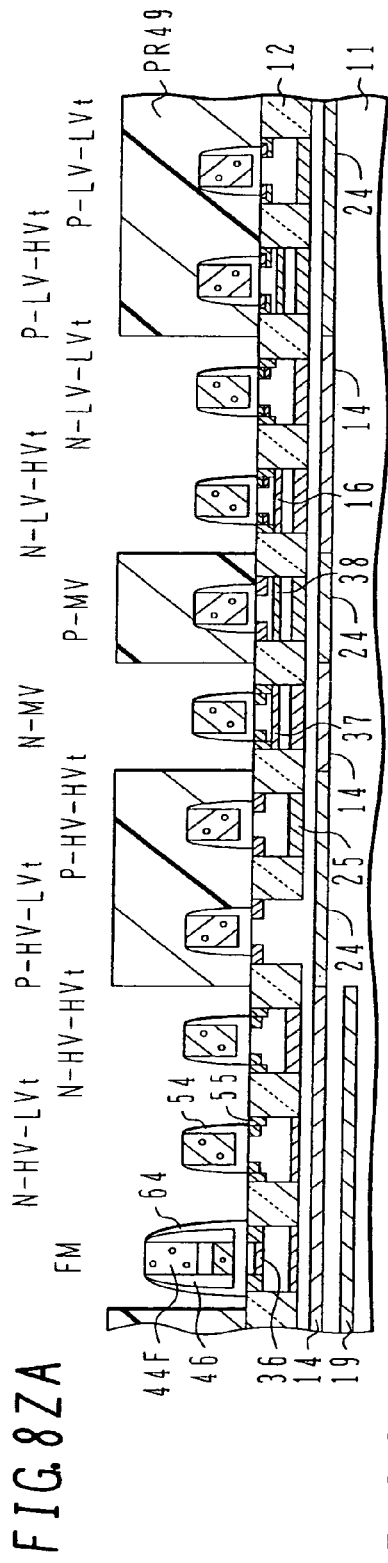
Figure 8Z:
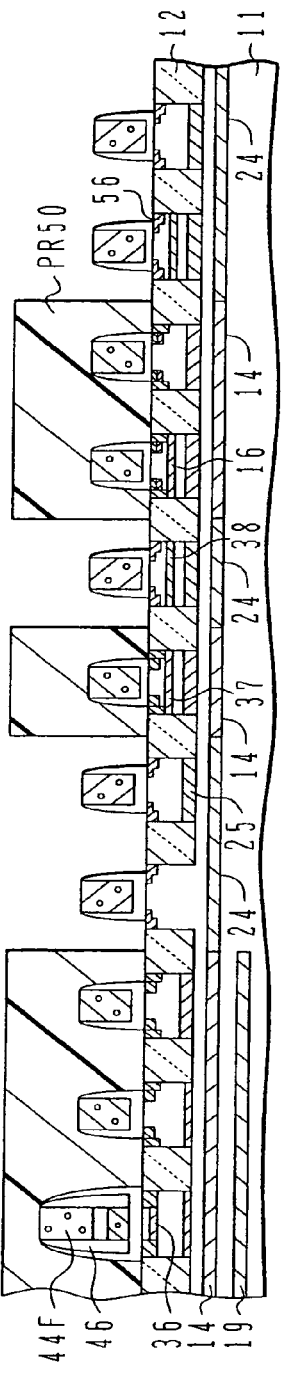
Figure 8Z:
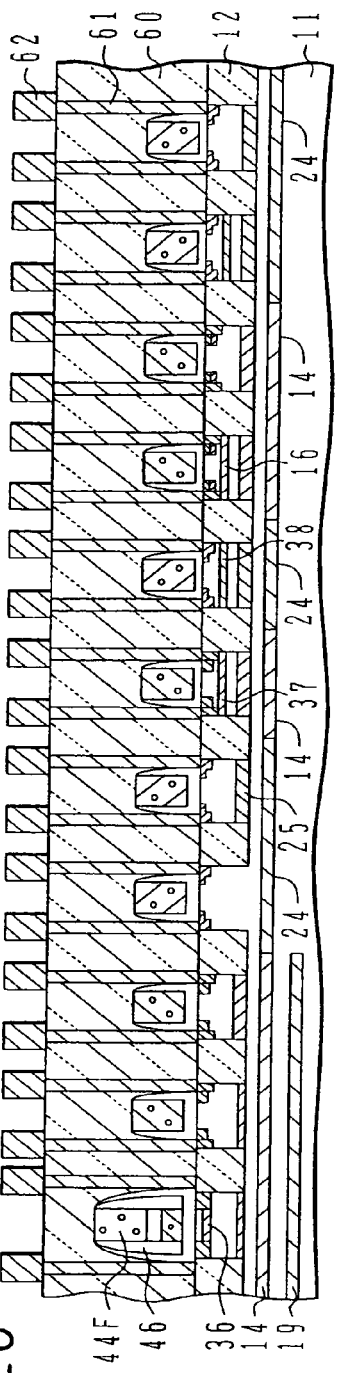

As shown in FIG. 8Z, a resist mask PR48 is formed exposing the high voltage n-channel MOS transistor N-HV region, and $P^+$ ions are implanted at an acceleration energy of 35 keV and a dose of $4.0 \times 10^{13}$ cm$^{-2}$ to form extension regions 52. The resist mask PR48 is thereafter removed.

As shown in FIG. 8ZA, a silicon oxide film is deposited on the whole substrate surface and reactive ion etching is performed to form side wall spacers 54. A resist mask PR49 is formed exposing the n-channel MOS transistor region, and $P^+$ ions are implanted at an acceleration energy of 10 keV and a dose of $6.0 \times 10^{15}$ cm$^{-2}$ to form source/drain regions 55. While the n-type source/drain regions 55 are formed, n-type impurity ions are also doped in the gate electrode. The resist mask PR49 is thereafter removed.

As shown in FIG. 8ZB, a resist mask PR50 is formed exposing the p-channel MOS transistor region, and $B^+$ ions are implanted at an acceleration energy of 5 keV and a dose of $4.0 \times 10^{15}$ cm$^{-2}$ to form source/drain regions 56. While the p-type source/drain regions 56 are formed, p-type impurity ions are also doped in the gate electrode. The resist mask PR50 is thereafter removed.

As shown in FIG. 8ZC, an interlayer insulating film 60 is deposited covering the gate electrodes, and contact holes are formed through the interlayer insulating film. Conductive plugs 61 are buried in the contact holes. Wirings 62 are formed on the surface of the interlayer insulating film. Thereafter, if necessary, insulating films and wirings are formed to form a multilayer wiring structure and complete a semiconductor device.

FIGS. 10A to 10J illustrate a CMOS semiconductor device manufacture method capable of further reducing the number of processes.

Figure 10A:
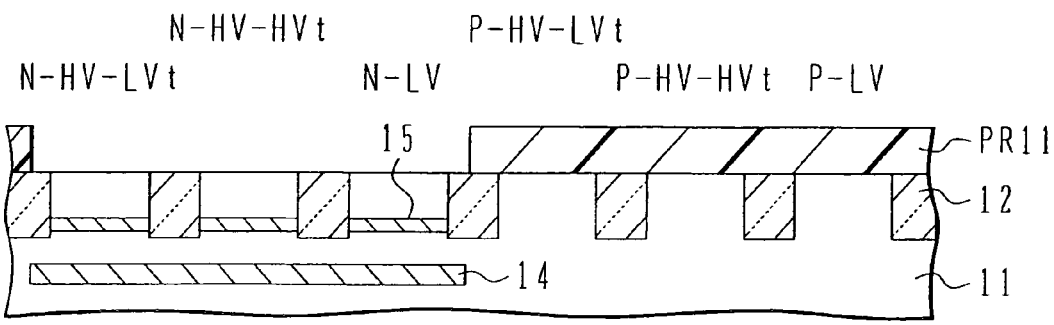
FIGS. 10A to 10J are cross sectional views illustrating a semiconductor device manufacture method according to another embodiment of the present invention.

As shown in FIG. 10A, a resist mask PR11 is formed exposing the n-channel transistor region, $B^+$ ions are implanted at an acceleration energy of 400 keV and a dose of $1.5 \times 10^{13}$ cm$^{-2}$ to form wells 14, and $B^+$ ions are implanted at an acceleration energy of 100 keV and a dose of $8 \times 10^{12}$ cm$^{-2}$ to form channel stop regions 15. The resist mask PR11 is thereafter removed.

The dose of $8 \times 10^{12}$ cm$^{-2}$ is equal to a sum of the doses of ion implantation processes shown in FIGS. 5A and 5B. Since the channel stop regions are formed in the whole region of the n-channel transistors, the threshold voltage of a high voltage, low threshold voltage n-channel MOS transistor N-HV-LVt is larger than a desired value.

Figure 10B:
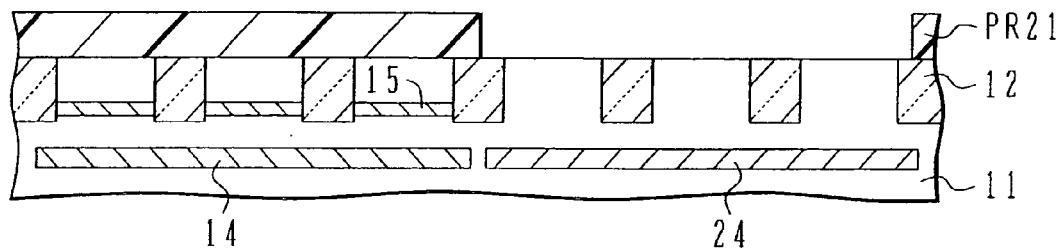

As shown in FIG. 10B, a resist mask PR21 is formed exposing the p-channel transistor region, and $P^+$ ions are implanted at an acceleration energy of 600 keV and a dose of $3.0 \times 10^{13}$ cm$^{-2}$ to form n-type wells 24. The resist mask PR21 is thereafter removed.

Figure 10C:
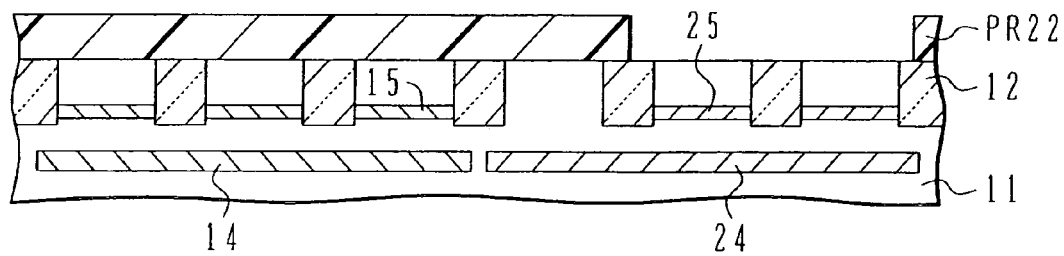

As shown in FIG. 10C, a resist mask PR22 is formed exposing the region of a high voltage, high threshold voltage p-channel transistor P-HV-HVt and a low voltage p-channel transistor P-LV, and $P^+$ ions are implanted at an acceleration energy of 240 keV and a dose of $5.0 \times 10^{12}$ cm$^{-2}$ to form n-type channel stop regions 25. The resist mask PR22 is thereafter removed.

Figure 10D:
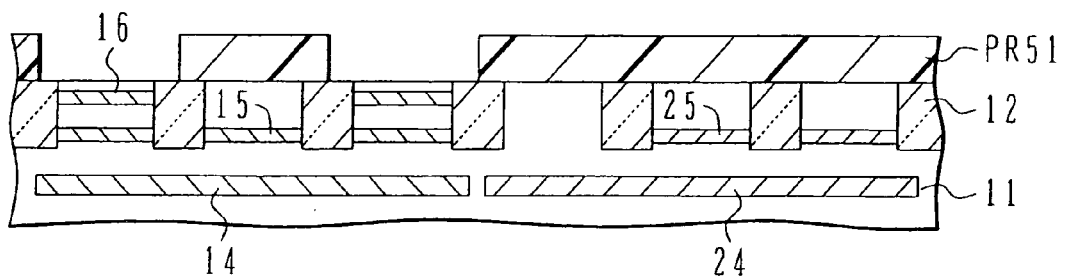

As shown in FIG. 10D, a resist mask PR51 is formed exposing the region of a low voltage n-channel transistor N-LV and the high voltage, low threshold voltage n-channel transistors N-HV-LVt, and $B^+$ ions are implanted at an acceleration energy of 10 keV and a dose of $2.5 \times 10^{12}$ cm$^{-2}$ to form threshold voltage adjusting regions 16. This dose is smaller than, for example, the dose of $4 \times 10^{12}$ cm$^{-2}$ of the ion implantation process shown in FIG. 5E. The resist mask PR51 is thereafter removed.

Figure 10E:
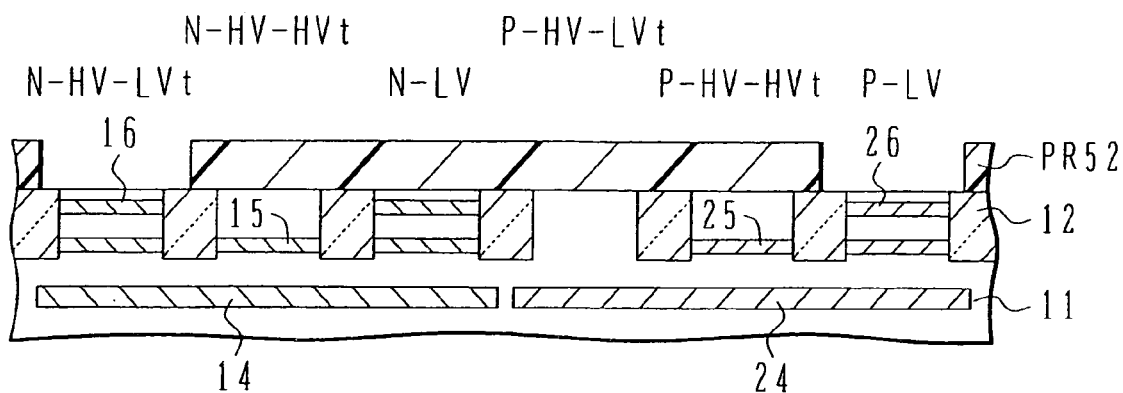

As shown in FIG. 10E, a resist mask PR52 is formed exposing the region of the high voltage, low threshold voltage n-channel transistor N-HV-LVt and low voltage p-channel transistor P-LV, and $As^+$ ions are implanted at an acceleration energy of 100 keV and a dose of $5 \times 10^{12}$ cm$^{-2}$ to form a threshold voltage adjusting region 26 of the low voltage p-channel MOS transistor. This dose is equal to the dose of the ion implantation process shown in FIG. 5E.

Although boron (B) and arsenic (As) ions are implanted into the high voltage, low threshold voltage n-channel transistor N-HV-LVt, the threshold voltage is a desired value of 0.2 V because a difference between impurity ion distributions. The resist mask PR52 is thereafter removed.

Thereafter, gate insulating films having two different thicknesses are grown and gate electrodes are formed thereon by a well-known method. A dose of the threshold voltage adjusting region 16 of the low voltage n-channel transistor N-LV is insufficient and the threshold voltage is low.

Figure 10F:
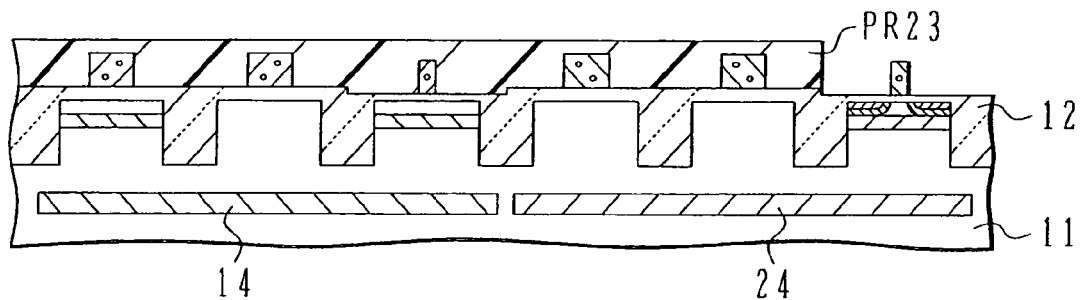

As shown in FIG. 10F, a resist mask PR23 is formed exposing the region of the low voltage p-channel transistor P-LV, and ion implantation processes are performed to form extension regions and pocket regions. For the extension regions, $B^+$ ions are implanted at an acceleration energy of 0.5 keV and a dose of $3.6 \times 10^{14}$ cm$^{-2}$. For the pocket regions, $As^+$ ions are implanted along four directions tilted by 28 degrees from the substrate normal direction at an acceleration energy of 80 keV and each dose of $6.5 \times 10^{12}$ cm$^{-2}$. The ion implantation conditions are the same as those of the ion implantation process shown in FIG. 8U. The resist mask PR23 is thereafter removed.

Figure 10G:
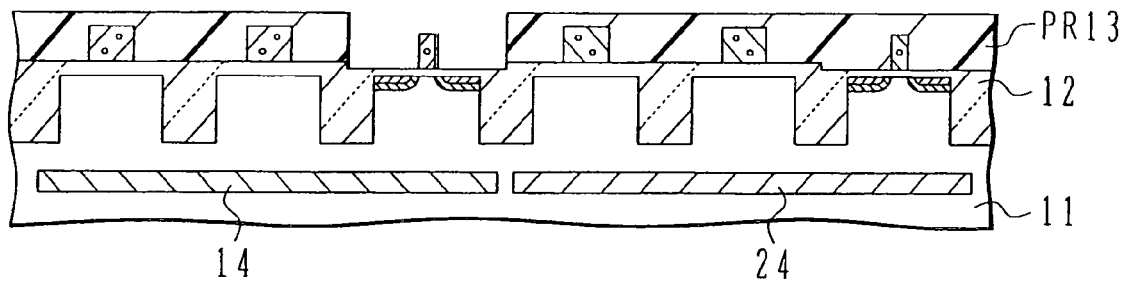

As shown in FIG. 10G, a resist mask PR13 is formed exposing the region of the low voltage n-channel transistor N-LV, and ion implantation processes are performed. $As^+$ ions are implanted at an acceleration energy of 3 keV and a dose of $1 \times 10^{15}$ cm$^{-2}$ to form extension regions. $BF_2^+$ ions are implanted along four directions tilted by 28 degrees from the substrate normal direction at an acceleration energy of 35 keV and each dose of $1.2 \times 10^{13}$ cm$^{-2}$ to form pocket regions. The dose of $1.2 \times 10^{13}$ cm$^{-2}$ for the pocket region is larger than the $BF_2$ dose of $9.5 \times 10^{12}$ cm$^{-2}$ for the pocket regions shown in FIG. 8V of the previously described embodiment, resulting in the effect of raising the threshold voltage. In this manner, the threshold voltage of the low voltage n-channel transistor is adjusted to a proper value. The resist mask PR13 is thereafter removed.

Figure 10H:
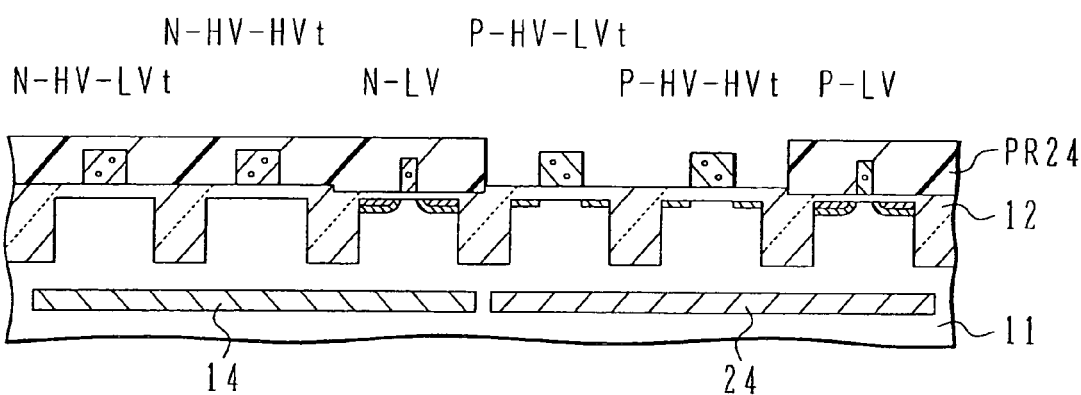

As shown in FIG. 10H, a resist mask PR24 is formed exposing the region of the high voltage p-channel transistors, and ion implantation is performed to form extension regions. For example, $BF_2^+$ ions are implanted at an acceleration energy of 80 keV and a dose of $4.5 \times 10^{13}$ cm$^{-2}$. The ion implantation conditions are the same as those of the ion implantation process shown in FIG. 8Y. The resist mask PR24 is thereafter removed.

Figure 10I:
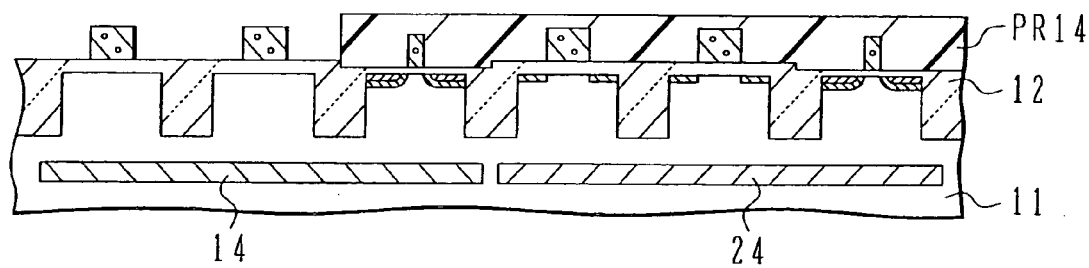

As shown in FIG. 10I, a resist mask PR14 is formed exposing the region of the high voltage n-channel MOS transistors, and ion implantation is performed to form extension regions. For example, $P^+$ ions are implanted at an acceleration energy of 35 keV and a dose of $4.0 \times 10^{13}$ cm$^{-2}$. The ion implantation conditions are the same as those of the ion implantation process shown in FIG. 8Z. Thereafter, side wall spacers are formed and ion implantation is performed to form high concentration source/drain regions.

Figure 10J:
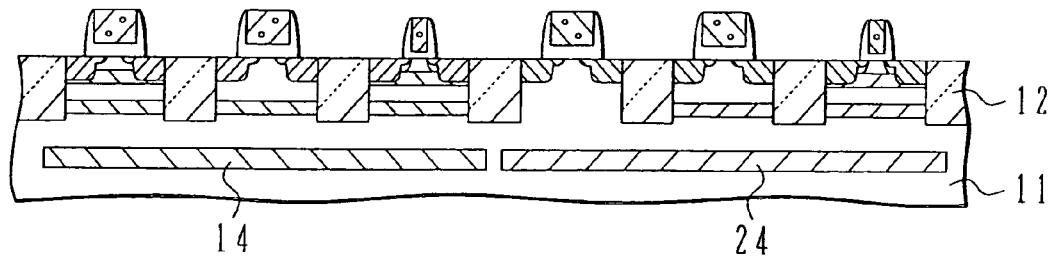
Figure 11A:
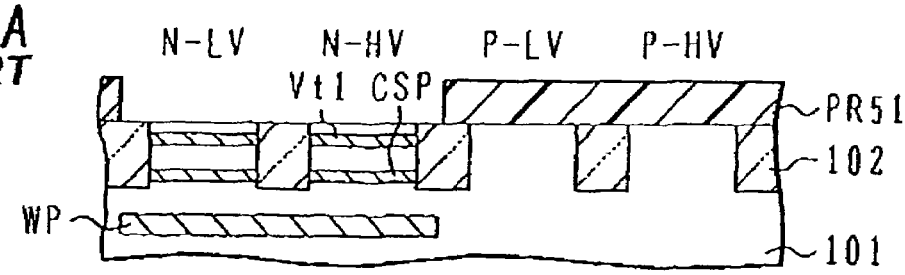
FIG. 11A to 11F are cross sectional views illustrating main processes of a method of manufacturing CMOS transistors operating at high and low voltages according to standard manufacture techniques.
Figure 11B:
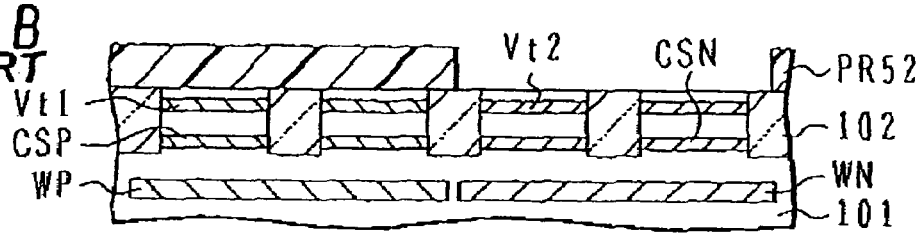
Figure 11C:
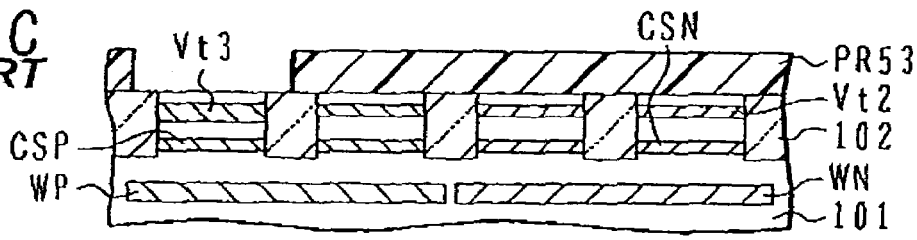
Figure 11D:
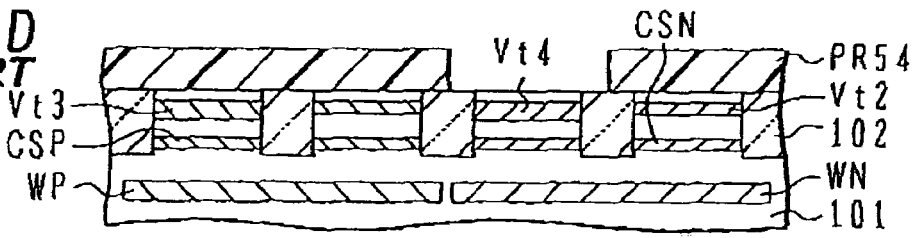
Figure 11E:
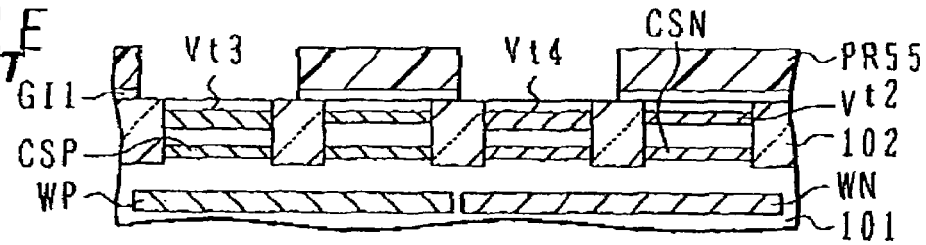
Figure 11F:
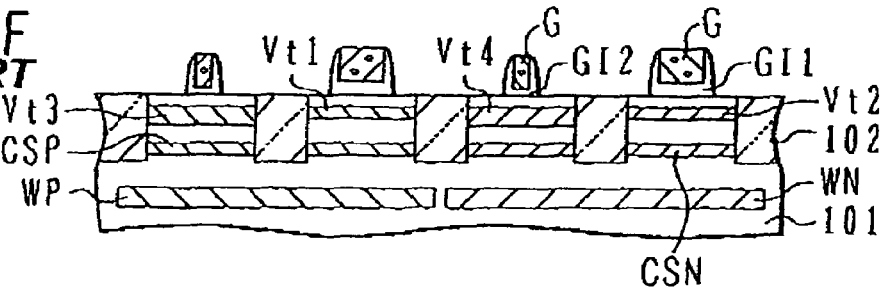
Figure 12A:
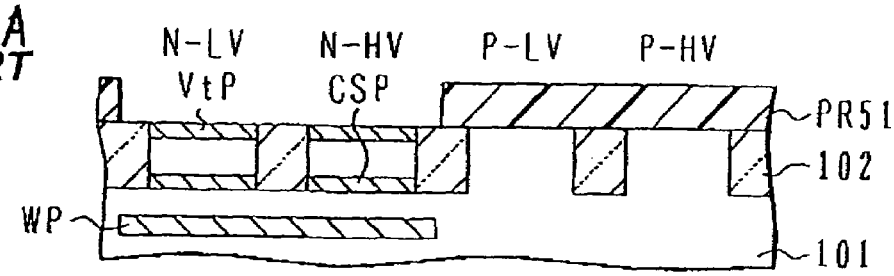
FIGS. 12A to 12E are cross sectional views illustrating an example of a method of manufacturing, with simple processes, CMOS transistors operating at high and low voltages.
Figure 12B:
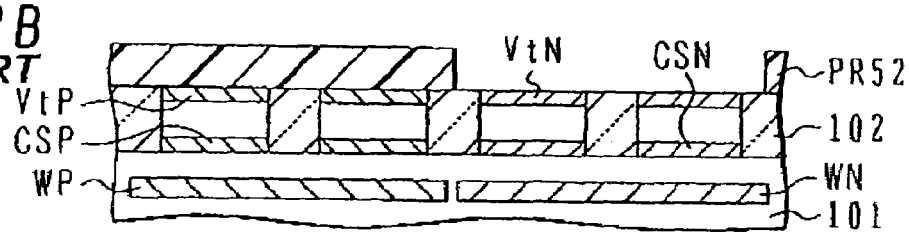
Figure 12C:
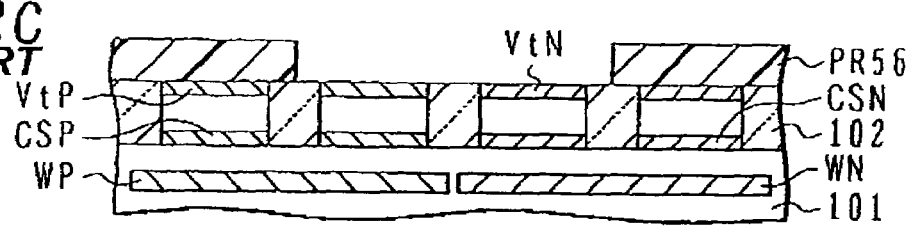
Figure 12D:
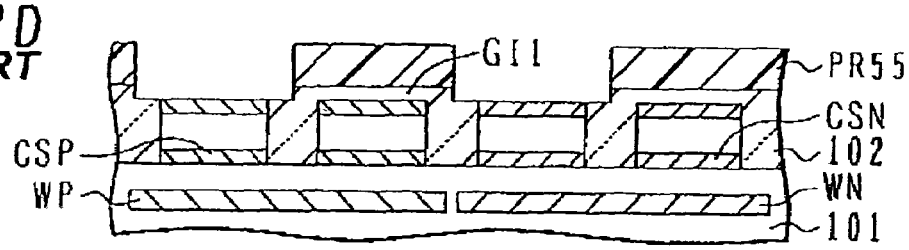
Figure 12E:
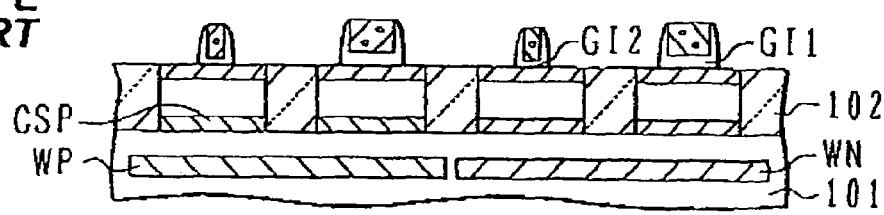

FIG. 10J is a schematic diagram showing the structure of the semiconductor device formed in the above manner. In a transistor with pocket regions, the threshold voltage can be adjusted by the impurity concentration in the pocket regions.

The present invention has been described in connection with the preferred embodiments. The invention is not limited only to the above embodiments. For example, an acceleration energy and a dose of impurity ions to be implanted are changed with designs. Various insulators may be used as a hard mask layer. It will be apparent to those skilled in the art that other various modifications, improvements, combinations, and the like can be made.

INDUSTRIAL APPLICABILITY

The embodiments are widely applicable to semiconductor devices mixing a plurality type of semiconductor circuits such as a system on-chip.

What we claim are:

1. A manufacture method for a semiconductor device, comprising steps of:
   (a) forming an isolation region in a semiconductor substrate, said isolation region extending from a surface of said semiconductor substrate to a first depth position;
   (b) forming first and second wells of a first conductivity type in said semiconductor substrate;
   (c) forming a gate insulating film having a first thickness on a surface of said first well and forming a gate insulating film having a second thickness thinner than the first thickness on a surface of said second well;
   (d) forming gate electrodes on said gate insulating films; and
   (e) forming source/drain regions in said semiconductor substrate on both sides of said gate electrodes,
   wherein said step (b) comprises steps of: (b1) performing ion implantation commonly to said first and second wells to form a first impurity concentration distribution having a maximum value only at a depth position equal to or deeper than said first depth position; (b2) selectively performing ion implantation to said first and/or second wells to form a second impurity concentration distribution having a maximum value at a depth position approximately equal to said first depth position; and (b3) performing ion implantation only to said second well to form a third impurity concentration distribution having a maximum value at a depth position shallower than said first depth position, and
   wherein said first well has only the first impurity concentration distribution having a maximum value at a depth equal to or deeper than said first depth position.

2. The manufacture method for a semiconductor device according to claim 1, wherein said step (b2) performs ion implantation to said second well to form said second impurity concentration distribution and excludes said ion implantation to the first well by masking.

3. The manufacture method for a semiconductor device according to claim 1, wherein said step (b) further forms a third well of the first conductivity type, said step (c) forms a gate insulating film having the first thickness on a surface of said third well, said step (b1) performs ion implantation also to said third well to form said first impurity concentration distribution, and said step (b2) performs ion implantation to said second and third wells to form said second impurity concentration distribution.

4. A manufacture method for a semiconductor device, comprising steps of:
   (a) forming an isolation region in a semiconductor substrate, said isolation region extending from a surface of said semiconductor substrate to a first depth position;
   (b) forming first and second wells of a first conductivity type in said semiconductor substrate;
   (c) forming a gate insulating film having a first thickness on a surface of said first well and forming a gate insulating film having a second thickness thinner than the first thickness on a surface of said second well;
   (d) forming gate electrodes on said gate insulating films; and
   (e) forming source/drain regions in said semiconductor substrate on both sides of said gate electrodes,
   wherein said step (b) comprises steps of: (b1) performing ion implantation commonly to said first and second wells to form a first impurity concentration distribution having a first peak only at a depth position equal to or deeper than said first depth position; (b2) selectively performing ion implantation to said first and/or second wells to form a second impurity concentration distribution having a second peak at a depth position approximately equal to said first depth position; and (b3) performing ion implantation only to said second well to form a third impurity concentration distribution having a third peak at a depth position shallower than said first depth position, and wherein said first well has only the first impurity concentration distribution having a peak at a depth equal to or deeper than said first depth position.

5. The manufacture method for a semiconductor device according to claim 4, wherein said step (b2) performs ion implantation to said second well to form said second impurity concentration distribution.

6. The manufacture method for a semiconductor device according to claim 4, wherein said step (b) further forms a third well of the first conductivity type, said step (c) forms a gate insulating film having the first thickness on a surface of said third well, said step (b1) performs ion implantation also to said third well to form said first impurity concentration distribution, and said step (b2) performs ion implantation to said second and third wells to form said second impurity concentration distribution.

* * * * *